(12) United States Patent
Wang et al.

(10) Patent No.: US 11,519,788 B2
(45) Date of Patent: Dec. 6, 2022

(54) ELASTOMERIC TEMPERATURE SENSOR

(71) Applicant: President and Fellows of Harvard College, Cambridge, MA (US)

(72) Inventors: Yecheng Wang, Cambridge, MA (US); Kun Jia, Allston, MA (US); Canhui Yang, Somerville, MA (US); Guoyong Mao, Zhejiang (CN); Zhigang Suo, Lexington, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 621 days.

(21) Appl. No.: 16/491,986

(22) PCT Filed: Mar. 6, 2018

(86) PCT No.: PCT/US2018/021057
§ 371 (c)(1),
(2) Date: Sep. 6, 2019

(87) PCT Pub. No.: WO2018/165100
PCT Pub. Date: Sep. 13, 2018

(65) Prior Publication Data
US 2021/0140832 A1 May 13, 2021

Related U.S. Application Data

(60) Provisional application No. 62/467,645, filed on Mar. 6, 2017.

(51) Int. Cl.
*G01K 1/14* (2021.01)
*G01N 27/333* (2006.01)
(Continued)

(52) U.S. Cl.
CPC .............. *G01K 1/14* (2013.01); *G01K 7/00* (2013.01); *G01K 13/10* (2013.01); *G01N 27/30* (2013.01);
(Continued)

(58) Field of Classification Search
CPC ............ G01K 1/14; G01K 7/00; G01K 13/10; G01N 27/30; G01N 27/333; G01N 27/49; H01L 41/1132; H01L 41/193
See application file for complete search history.

(56) References Cited

U.S. PATENT DOCUMENTS 5,018,527 A * 5/1991 Pfab .................... G01N 27/3335
204/403.06
10,251,238 B2 * 4/2019 Wang .................... C09K 11/883
(Continued)

FOREIGN PATENT DOCUMENTS

CN 104215354 A 12/2014
WO WO-2014/169119 A1 10/2014

OTHER PUBLICATIONS

Agar et al., "Single-Ion Heat of Transport in Electrolyte Solutions, A Hydrodynamic Theory," The Journal of Physical Chemistry A, Mar. 1, 1989, pp. 2079-2082.
(Continued)

*Primary Examiner* — Nathaniel T Woodward
*Assistant Examiner* — Philip L Cotey
(74) *Attorney, Agent, or Firm* — Wilmer Cutler Pickering Hale and Dorr LLP

(57) ABSTRACT

A stretchable temperature sensor includes one or more elastomeric ionic conducting layers; at least two electronic conducting elements, wherein the one or more ionic conducting layers and one or more electronic conducting elements are configured and arranged to provide at least one electrical double layer at a first contact area between the
(Continued)

ionic conducting layer and a first electronic conducting element in a sensing end and at least one electrical double layer at a contact area between the ionic conducting layer and a second electronic conducting element in an open end of the temperature sensor; wherein the second electronic conducting element provides a connection at the open end to an external circuit for measuring a signal generated in response to a temperature condition at the sensing end.

35 Claims, 18 Drawing Sheets

(51) Int. Cl.
    *G01K 13/10*     (2006.01)
    *G01N 27/49*     (2006.01)
    *H01L 41/193*     (2006.01)
    *H01L 41/113*     (2006.01)
    *G01K 7/00*     (2006.01)
    *G01N 27/30*     (2006.01)

(52) U.S. Cl.
    CPC .......... *G01N 27/333* (2013.01); *G01N 27/49* (2013.01); *H01L 41/1132* (2013.01); *H01L 41/193* (2013.01)

(56) References Cited

U.S. PATENT DOCUMENTS

| | | | | |
|---|---|---|---|---|
| 2011/0180406 | A1* | 7/2011 | Hirshberg | G01N 27/333 204/406 |
| 2014/0160623 | A1* | 6/2014 | Baer | B32B 27/08 361/301.4 |
| 2016/0025669 | A1* | 1/2016 | Sun | G01N 27/305 204/418 |
| 2018/0038745 | A1* | 2/2018 | Madden | G01L 11/00 |
| 2018/0067066 | A1* | 3/2018 | Giedd | G01N 33/0031 |
| 2018/0080830 | A1* | 3/2018 | Daraio | G01J 5/24 |
| 2018/0242851 | A1* | 8/2018 | Van Den Ende | A61B 1/0008 |
| 2018/0249550 | A1* | 8/2018 | Wang | H05B 33/145 |
| 2021/0140832 | A1* | 5/2021 | Wang | G01K 1/14 |

OTHER PUBLICATIONS

Arora et al., "Effectiveness of a noninvasive digital infrared thermal imaging system in the detection of breast cancer," The American Journal of Surgery, Oct. 2008, vol. 196(4), pp. 523-526.

Byrne et al., "The ingestible telemetric body core temperature sensor: a review of validity and exercise applications," British Journal of Sports Medicine, Mar. 2007, vol. 41(3), pp. 126-133.

International Search Report and Written Opinion dated May 16, 2018, in the International Application No. PCT/US18/21057. 14 pages.

Keplinger et al., "Stretchable, Transparent, Ionic Conductors," Science, Aug. 30, 2013, vol. 341, 984-987.

Kerlin et al., "Thermocouples: What one needs to know," InTech Magazine, Sep.-Oct. 2011. 3 pages.

Kim et al., "Epidermal Electronics," Science, Aug. 12, 2011, vol. 333(6044), pp. 838-843 (8 total pages).

Lanzara et al., "A Spider-Web-Like Highly Expandable Sensor Network for Multifunctional Materials," Advanced Materials, Nov. 2, 2010, vol. 22(41), pp. 4643-4648.

Leick-Rude et al., "A Comparison of Temperature-Taking Methods in Neonates," Neonatal Network, vol. 17, No. 5, Aug. 1998, pp. 21-37.

Mike et al., "Recent Advances in Conjugated Polymer Energy Storage," Journal of Polymer Science, Part B: Polymer Physics, Apr. 1, 2013, vol. 51(7), pp. 468-480.

Park et al., "Fabrication of amorphous InGaZnO thin-film transistor-driven flexible thermal and pressure sensors," Semiconductor Science and Technology, Aug. 7, 2012, vol. 27, No. 10, pp. 1-6 (7 total pages).

Putnam et al., "Transport of Nanoscale Latex Spheres in a Temperature Gradient," Langmuir, May 13, 2005, vol. 21, No. 12, pp. 5317-5323.

Sun et al., "Highly stretchable and tough hydrogels," Nature, Sep. 6, 2012, vol. 489, pp. 133-136.

Wagner et al., "Electronic skin: architecture and components," Physica E: Low dimensional Systems and Nanostructures, Jul. 28, 2004, vol. 25, pp. 326-334.

Webb et al., "Thermal Transport Characteristics of Human Skin Measured In Vivo Using Ultrathin Conformal Arrays of Thermal Sensors and Actuators," PLoS One, Feb. 6, 2015, vol. 10(2), pp. 1-17.

Webb et al., "Ultrathin conformal devices for precise and continuous thermal characterization of human skin," Nature Materials, Sep. 15, 2013, vol. 12, pp. 938-944 (8 total pages).

Yang et al., "Ionic cable," Extreme Mechanics Letters, Mar. 7, 2015, vol. 3, pp. 59-65.

Yokota et al., "Ultraflexible, large-area, physiological temperature sensors for multipoint measurements," Proceedings of the National Academy of Sciences of the United States of America, Nov. 24, 2015, vol. 112, No. 47, pp. 14533-14538.

\* cited by examiner

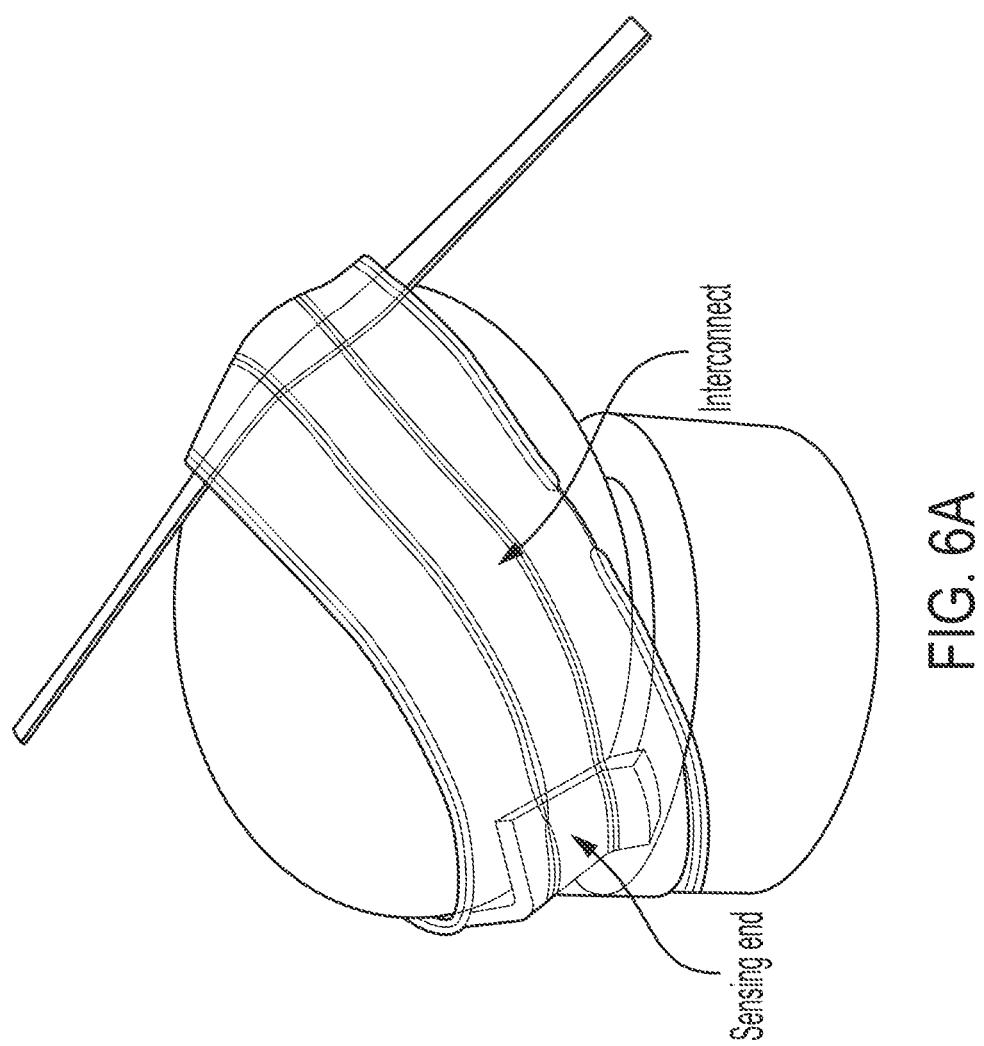

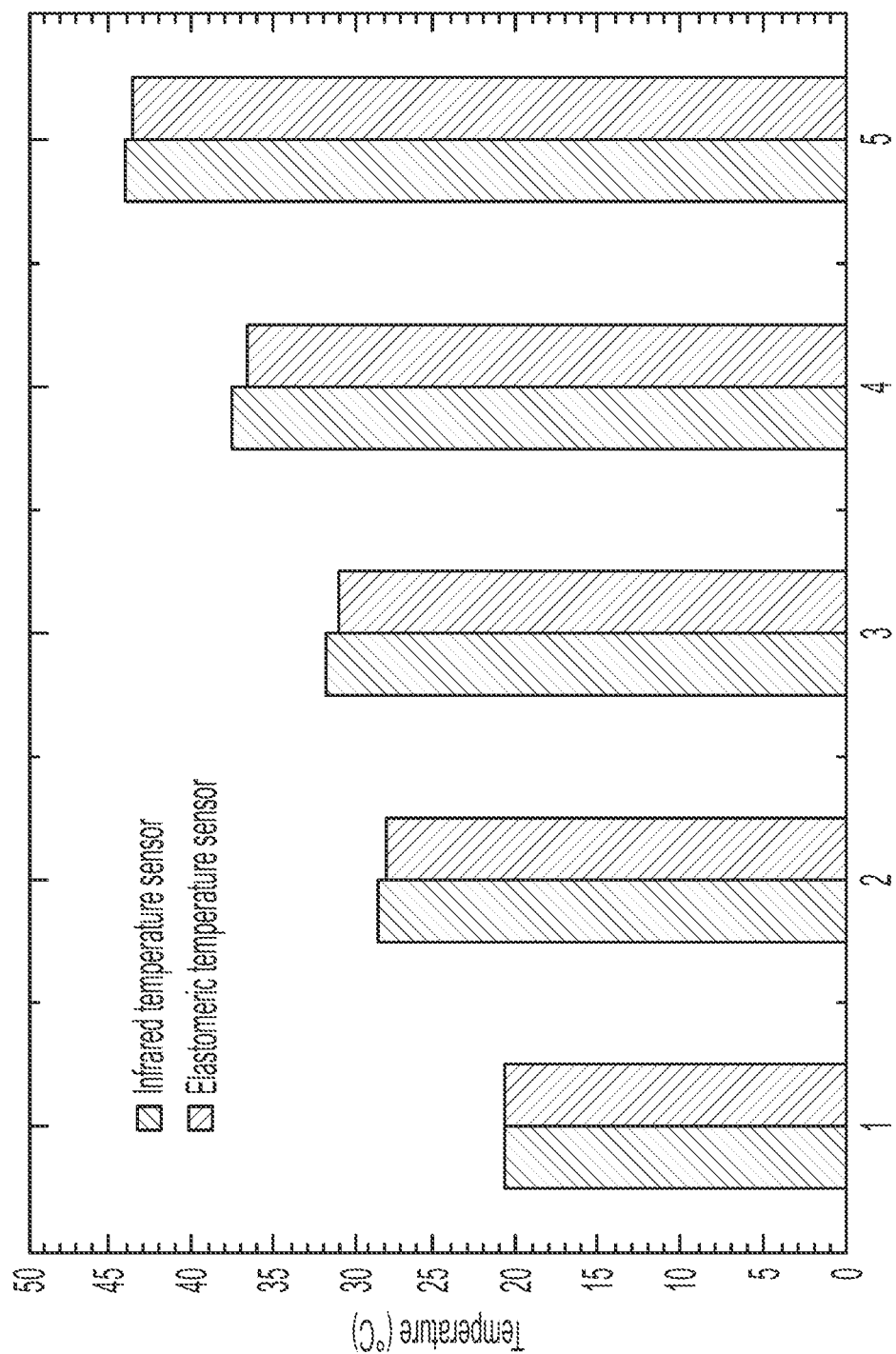

ELASTOMERIC TEMPERATURE SENSOR

RELATED APPLICATIONS

The present application is a National Stage Entry of PCT International Application Number PCT/US2018/021057, filed Mar. 6, 2018, which claims the benefit of priority to U.S. Provisional Application No. 62/467,645, filed Mar. 6, 2017, both of which are incorporated by reference in their entireties.

STATEMENT REGARDING FEDERALLY SPONSORED RESEARCH OR DEVELOPMENT

This invention was made with government support under Grant DMR 14-20570 awarded by National Science Foundation. The government has certain rights in the invention.

INCORPORATION BY REFERENCE

All patents, patent applications and publications cited herein are hereby incorporated by reference in their entirety to describe the state of the art more fully as known to those skilled therein as of the date of the invention described herein

TECHNICAL FIELD

This technology relates generally to temperature sensors. This invention relates to stretchable temperature sensors. The technology also relates temperature sensors showing good mechanical flexibility, sensitivity, and efficiency.

BACKGROUND

Temperature monitoring plays a significant role not only in human health (e.g., body surface/core temperature, homeostasis, etc.), but also in structure health. Most of the widely used metallic thermistors and thermocouples are rigid. However, many surfaces of living tissues and engineering structures are curved, making it a challenge to apply these conventional thermometers due to two mismatches: softness vs. hardness of materials and curved vs. flat surface. Also, rigid conventional thermometers irritate the surfaces and modify their properties by thermal and mechanical loading. Without robust adhesion, artifacts arising from relative motion of the thermometers and the target surfaces result in considerable errors. Therefore, to realize conformal and reliable temperature measurement, soft and stretchable thermometers are desired.

Recently, several flexible temperature sensors with satisfying mechanical flexibility, efficiency and sensitivity have been developed by taking advantage of the temperature-dependent resistance of electronic conductors. Elaborate designs have been employed to realize conformal temperature measurement. Serpentine metallic wire and metallic nanotech structure are the representative methods. However, for temperature monitoring on highly deformable objects or dynamically moving objects, deformation-induced resistivity change, sometimes orders-of-magnitude higher, is coupled with thermal-induced resistivity change, which is difficult to be distinguished. Thus, sufficient accuracy cannot be ensured. In addition, the temperature change does not generate signals, indicating that these prototype devices require an external power supply, leading to more complicated electric circuits and higher measurement cost. Although they offer matched mechanical properties, the sensor itself is rigid and not stretchable, which does not meet the requirement of conformity. Further, cost-effective and easy-to-fabricate process ability is indispensable, limiting their large-scale applications in practice.

In contrast to electronic conductors, ionic conductors, typically hydrogels and ion gels, transmit signals through ions. As ionic conductors integrate conductivity and stretchability at molecular level, especially maintaining conductivity under large deformation, they have shown the capability of functioning as stretchable and transparent conductors in diverse smart devices. On the other end, the electrical double layer (EDL) is universal at solid-liquid interfaces, functioning as a capacitor, and a potential drop exists at the interface. Many efforts have been made to study the EDL since first identified by Helmholtz in the middle of the nineteenth century. EDL plays a significant role in electronic devices. EDL capacitors, as an emerging technology, can store more energy than conventional capacitors and deliver more power than normal batteries. Due to the concentration-dependence of EDL capacitors, energy extraction, desalination and water treatment can be realized through capacitive deionization technology.

SUMMARY

An electrical double layer (EDL)-based elastomeric temperature sensor employing ionic conductors is described. The temperature sensor can be used as a soft and stretchable thermometer in applications such as stretchable electronics, health care, and soft robots.

In one aspect, a stretchable temperature sensor, includes one or more elastomeric ionic conducting layers; at least two electronic conducting elements, wherein the one or more ionic conducting layers and one or more electronic conducting elements are configured and arranged to provide at least one electrical double layer at a first contact area between the ionic conducting layer and a first electronic conducting element in a sensing end and at least one electrical double layer at a contact area between the ionic conducting layer and a second electronic conducting element in an open end of the temperature sensor; wherein the second electronic conducting element provides a connection at the open end to an external circuit for measuring a signal generated in response to a temperature condition at the sensing end. In one aspect, a stretchable temperature sensor includes one or more elastomeric ionic conducting layers; at least first and second electronic conducting elements, wherein the one or more ionic conducting layers and the first and second electronic conducting elements are configured and arranged to provide at least one electrical double layer at a first contact area between the ionic conducting layer and the first electronic conducting element in a sensing end of the temperature sensor and at least one electrical double layer at a contact area between the ionic conducting layer and the second electronic conducting element in an open end of the temperature sensor; wherein the second electronic conducting element provides a connection at the open end to an external circuit for measuring a signal generated in response to a temperature condition at the sensing end.

In one or more embodiments, the temperature sensor includes an outer sealing layer to prevent or reduce water evaporation.

In any of the preceding embodiments, the ionic layer can include an elastomeric hydrogel.

In any of the preceding embodiments, the hydrogel fluid can be an electrolyte.

In any of the preceding embodiments, the sensor includes two elastomeric ionic layers having the first electronic conducting element disposed in between and in contact with at least a portion of each of the two elastomeric ionic conducting layers, and wherein two asymmetric electric double layers are formed between the electronic conducting layer and each of the elastomeric ionic conducting layers.

In any of the preceding embodiments, the sensor further includes an insulating layer positioned between the two ionic conductor layers to insulate the two ionic conductor layers from each other.

In any of the preceding embodiments, the first electronic conducting element comprises a first electrolyte having a first ion concentration and the second electronic conducting element comprises a first electrolyte having a first ion concentration, wherein the first salt concentration and the second salt concentration are different, and for example, first salt concentration is at least ten times greater than the second salt concentration, or first salt concentration is at least 10-100 times greater than the second salt concentration.

In any of the preceding embodiments, the second electronic conducting element includes a pair of electronic conducting elements in electrical contact with the two elastomeric ionic layers at the open end of the temperature sensor.

In any of the preceding embodiments, the sensor includes two electronic conducting elements having an ionic conducting layer disposed in between.

In any of the preceding embodiments, further comprising a third electronic conducting element, wherein the second and third electronic conducting elements are in electrical contact with the two elastomeric ionic layers at the open end of the temperature sensor.

In any of the preceding claims, the electrical double layers formed at each of the pair of electronic conducting elements with its respective ionic layer cancel each other out.

In any of the preceding embodiments, the sensor comprises first and second electronic conducting elements having a first elastomeric ionic conducting layer disposed in between, wherein two asymmetric electric double layers are formed between the first and second electronic conducting layers and the first ionic conducting layer.

In any of the preceding embodiments, the two electronic conducting elements are at opposing ends of the ionic layer and one end forms the electrical double layer of the sensing end and the other end forms the electrical double layer of the open end.

In any of the preceding embodiments, the first and second electronic conducting elements comprise first and second electronic conducting layers and the first and second electronic conducting layers are sandwiched around the first ionic conducting layer.

In any of the preceding embodiments, the two electronic conducting elements are different conductors and the electrical double layers formed by contact with the ionic conducting layer are different. However, the two electronic conducting elements do not have to be different. As long as there is a temperature difference between the sensing end and the open end, the sensor will generate a signal. Having two electronic conducting elements is advantageous for calibration.

In any of the preceding embodiments, the two electronic conducting elements provide a connection to an external circuit.

In any of the preceding embodiments, the sensor includes first and second elastomeric ionic layers, and further includes third and fourth electronic conducting elements, wherein the first electronic conducting element is disposed in between and in contact with at least a portion of the first elastomeric ionic conducting layers and the third electronic conducting element to form a first electric double layer, wherein the third electronic conducting element is disposed in between and in contact with at least a portion of the second elastomeric ionic conducting layers and the first electronic conducting element to form a second electric double layer, and wherein the first and second electric double layers are different.

In any of the preceding embodiments, the fourth electronic conducting element forms an electrical double layer at a contact area with the second ionic conducting layer in an open end of the temperature sensor.

In any of the preceding embodiments, the third and fourth electronic conducting elements are different conductors In another aspect, a stretchable temperature sensor, includes first and second elastomeric ionic conducting layers; and first and second electronic conducting elements, wherein the first and second ionic conducing layers comprise different electrolyte compositions, wherein the first and second ionic conducting layers are immiscible, and wherein a portion of the first and second ionic conducting layers are in contact with each other to form an electrical double layer of the sensing end, wherein a portion of the first and second ionic conducting layers are in contact with first and second electronic conducting elements, respectively, to provide electrical double layers at a in a sensing end of the temperature sensor and at least one electrical double layer at a contact area between the ionic conducting layer and the second electronic conducting element in an open end of the temperature sensor; wherein the first and second electronic conducting elements provide connections at the open end to an external circuit for measuring a signal generated in response to a temperature condition at the sensing end.

In one or more embodiments, the sensor further includes an insulating layer positioned between the two ionic conductor layers to insulate the two ionic conductor layers from each other.

In any of the preceding embodiments, the temperature at the open end is fixed.

In another aspect, a stretchable temperature sensor network, includes a plurality of sensors according to any of the preceding embodiments, wherein each of the sensors is separately connectable to an external detector.

In another aspect, a method of measuring a temperature change includes providing a temperature sensor according to any of the preceding embodiments; fixing the temperature at the open end of the sensor; and reading a voltage across the sensing end of the sensor, the voltage correlating to a temperature condition.

In any of the preceding embodiments, the temperature condition is a change in temperature.

In any of the preceding embodiments, the temperature condition is an absolute temperature of the sensing end.

In any of the preceding embodiments, the method includes fixing the temperature at the open end.

In another aspect, a stretchable temperature sensor network includes an elastomeric ionic conducting layer sandwiched between first and second electronic conducting layers, wherein the first and second electronic conducting layers are different and wherein two asymmetric electric double layers are formed between the elastomeric ionic conducting layer and each of the first and second electronic conducting layers; wherein the first and second electronic conducting element provides a connection to an external circuit for measuring a signal generated in response to a temperature condition at the two asymmetric electric double layers.

In one or more embodiments, the stretchable temperature sensor network includes a plurality of sensors, wherein each of the sensors is separately connectable to an external detector.

Compared with widely used resistive temperature detectors (RTD), one unique advantage of the EDL-based temperature sensor is that changing temperatures can generate signals, leading to much simpler electric circuits. In resistance measurement, a voltage must be applied by an external power supply, and the corresponding current is recorded (R=V/I). The working principle of the EDL-based elastomeric temperature sensor enables this unique and outstanding advantage, i.e., changing temperatures can generate signals, leading to much simpler electric circuits. Resistive temperature detectors (made of metals) and thermistors (made of semiconductors), which are widely used, do not possess this feature and external power supply is needed, leading to complicated electric circuits and high costs.

These and other aspects and embodiments of the disclosure are illustrated and described below.

BRIEF DESCRIPTION OF THE DRAWINGS

The invention is described with reference to the following figures, which are presented for the purpose of illustration only and are not intended to be limiting.

In the Drawings:

FIG. 6A is a photograph of a chicken egg with a conformal elastomeric temperature sensor, according to one or more embodiments.

FIG. 6C is a plot comparing the temperature of the surface of a chicken egg as measured using an electrical double layer based elastomeric temperature sensor system according to one or more embodiments and a commercial infrared thermometer.

DETAILED DESCRIPTION

Figure 1:
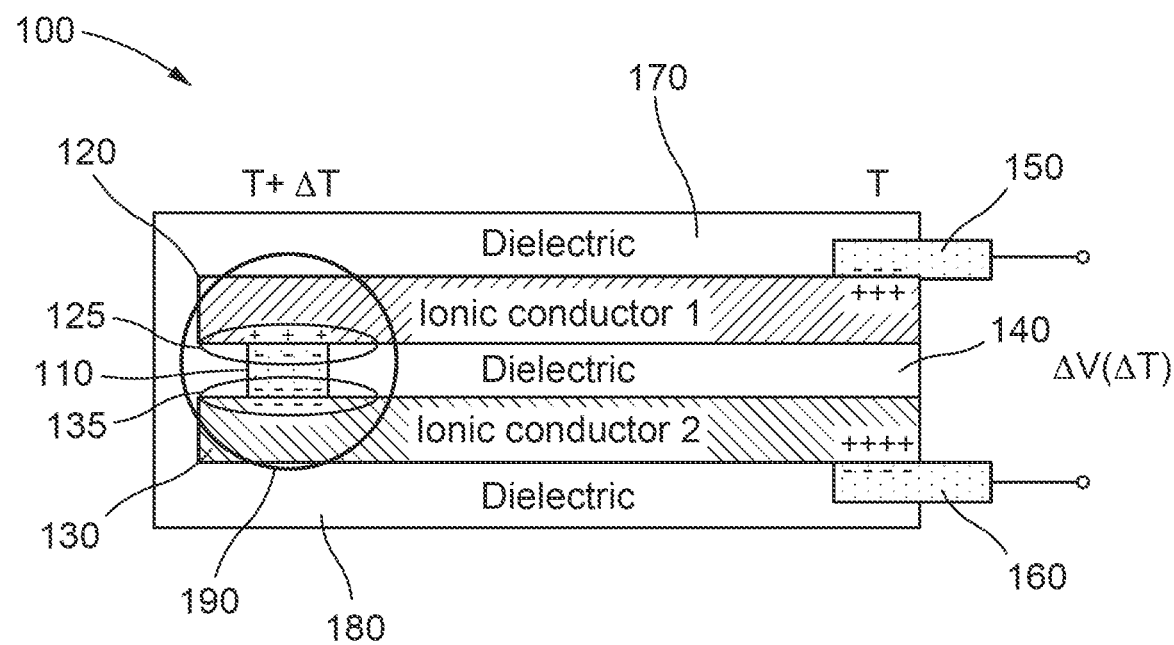
FIG. 1 is a schematic representation of an electrical double layer (EDL) based elastomeric temperature sensor according to one or more embodiments.

An electrical double layer (EDL) based elastomeric temperature sensor is described. The sensor employs ionic conductors not only for signal transmission, but also for sensing. As ionic conductors integrate conductivity and stretchability at molecular level, the sensor meets the requirement of conformity and stretchability in temperature measurement for unusual curved configurations. Moreover, the temperature sensor shows good stability and sensitivity. In one or more embodiments, the elastomeric temperature sensor can be used in stretchable electronics, health care and soft robots as a soft and stretchable temperature sensor.

In one aspect, an elastomeric temperature sensor is provided that includes at least one electrical double layer between an elastomeric ionic layer and an optionally elastomeric electronic conductor at the temperature sensing end and at least one electrical double layer between an elastomeric ionic layer and an elastomeric electronic conductor at the open end that is remote from the temperature sensing zone for reading a signal proportional to a temperature or a temperature change at the temperature sensing end of the device.

An electrical double layer forms at the interface between the electronic conductor and the ionic conductor. The charge on the electronic conductor is confined to the surface, such that ions in the ionic conductor needed to counterbalance the surface charge are adsorbed to the interface.

The EDL voltages at both ends are temperature-dependent and in series. In operation, the open end of the sensor is held at a constant or fixed temperature. Upon a change in temperature at the sensing end, ion distribution changes at the EDL can be observed by changes in voltage measured at the open end. Due to the nature of EDLs, even a small change in temperature can result in a measurable voltage change. For EDL-based temperature sensors, as long as stable EDLs can form at the interfaces, any materials for electronic conductor and ionic conductor will work and allow for signal generation.

The EDL-based elastomeric temperature sensor can contain one or more, e.g., two, EDLs at the temperature sensing end. An EDL-based elastomeric temperature sensor 100 is described with reference to FIG. 1, which uses two EDLs at the temperature sensing end. An electronic conductor 110 is sandwiched between two stripes of ionic conductor 120, 130. The ionic conductor includes stretchable polymer, such as an elastomer, and an electrolyte solution dispersed throughout the elastomer layer to provide a flexible, stretchable ionic layer. The two ionic conductors can use the same salts but have different ion concentrations for the temperature sensing. A dielectric layer 140 is disposed between the two ionic conductors to insulate the two ionic conductors from each other and the three-layered structure serves as a stretchable and transparent ionic cable. Two electronic conductors 150, 160 are used to connect the two ionic conductors separately at the open end to external circuit for signal measurement. The triple layer of ionic conductor 120/electronic conductor 110/ionic conductor 130 form the sensing end or "sensor" 190 of the device, while electronic conductors 150, 160 interact with the ionic conductors 110, 130, respectively, to form open ends that are connectable to an external circuit. The device can be sealed by layers 170, 180 to avoid water evaporation of the ionic conductors. The sealing layers can be fluid and/or vapor impermeable and/or insulating.

An electronic conductor is sandwiched by two ionic conductor layers with same salts but different ion concentrations. At the sensing end, a first electrical double layer forms at the first interface between the electronic conductor and the first ionic conductor, resulting in the first two parallel layers of charge surrounding the interface. A second electrical double layer forms at the second interface between the electronic conductor and the second ionic conductor having a different electrolyte (salt) concentration, resulting in the second two parallel layers of charge surrounding the interface. Accordingly, two inversely polarized EDLs 125, 135 form at the two interfaces between the electronic conductor and the ionic conductors. Because the ion concentrations of the two ionic conductors are not the same, the electrical double layers 125 and 135 formed, respectively, at the interface of each ionic conductor 120 and 130 with electronic conductor 110 are also different. Thus, two asymmetric EDLs form at the interfaces between the electronic conductor and the ionic conductors at the sensing end. Meanwhile, another two EDLs form at the open end between electronic conductor 150 and ionic conductor 120 and between electronic conductor 160 and ionic conductor 130.

Figure 3A:
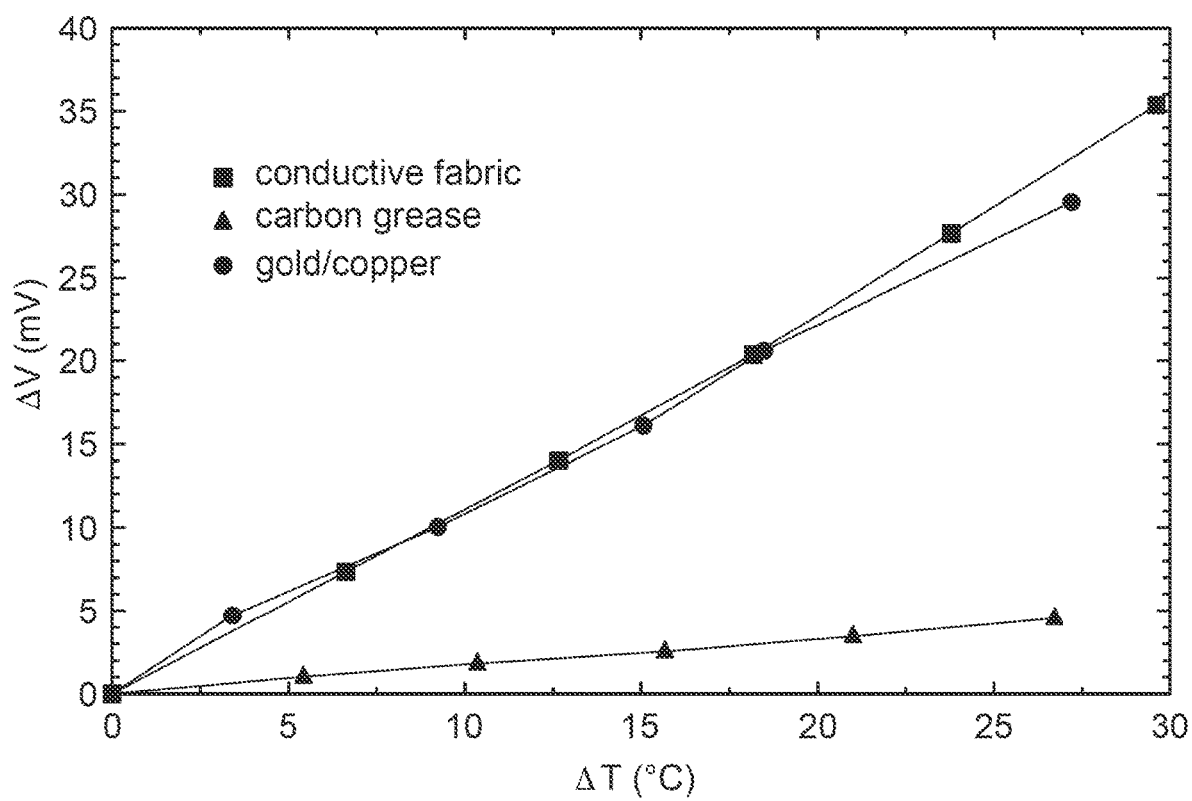
FIG. 3A is a plot of voltage change with temperature change in an electrical double layer based elastomeric temperature sensor system according to one or more embodiments demonstrating the performance with conductive fabric, carbon grease and gold coated on copper electronic conductors at the sensing end.
Figure 3B:
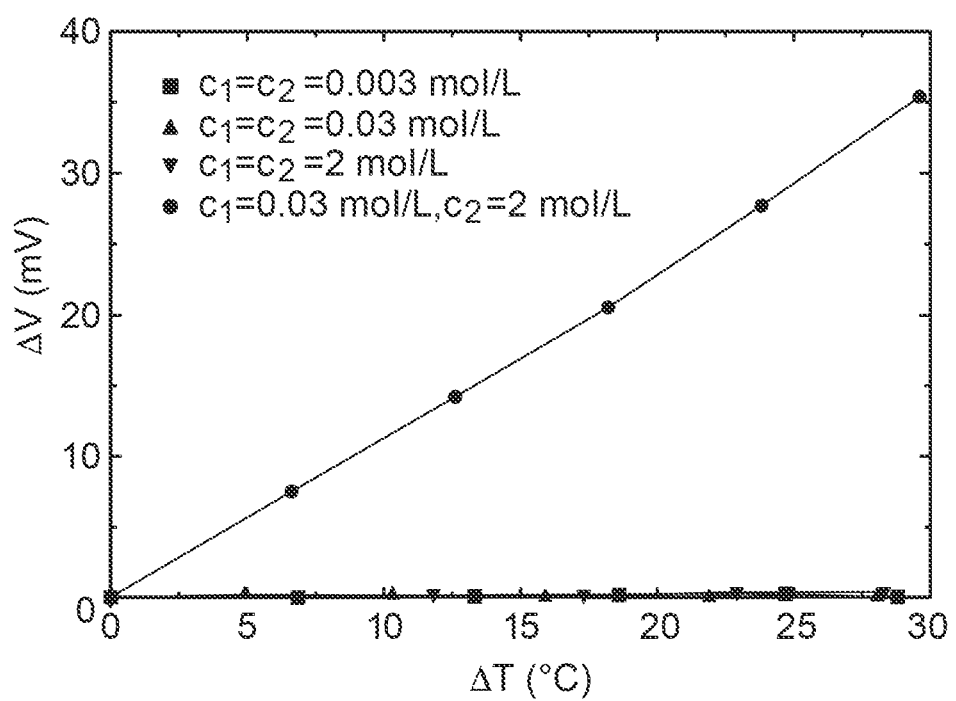
FIG. 3B is a plot of voltage change with temperature change in an electrical double layer based elastomeric temperature sensor system according to one or more embodiments demonstrating the performance with various NaCl concentration combinations in the ionic conductors. The results verify the proposed principle, showing the effect of different ion concentrations and ion-concentration related sensitivity.

The sensor performance is dominated by the EDL formed at the interface between the electronic conductor and the ionic conductor with lower ion concentration due to its larger Debye length, which is on the scale of 100 nm in the case of 0.03 mol/L. Typically, the performance is mainly influenced by the EDL between the electronic conductor and ionic conductor with dilute ion concentration (on the scale of 0.01 mol/L or lower). The contribution of ionic conductor with concentrated solution (on the scale of 0.1 mol/L or higher) can be neglected, as shown in FIG. 3B.

In principle, any type of salt will work as long as there is an ion concentration difference in the ionic conductors. Different salts give different performance (e.g., sensitivity, stability, etc.), due to their different properties (e.g., ion size, mobility, Debye length, adsorption, etc.). One advantage of replacing NaCl by LiCl is that water evaporation of ionic conductor can be reduced due to the more hygroscopic property of LiCl.

In operation as a temperature sensor, the temperature of the open ends is fixed, for example, at ambient, and the temperature at the sensor is determined. For a given sensor having the configuration shown in FIG. 1, a temperature difference $\Delta T$ between the sensing end and the open end leads to four different EDL voltages, inducing a corresponding voltage difference $\Delta V$. A voltmeter can be connected at the open end to record the voltage. Since the temperature at the open end is fixed, the temperature-dependent voltage reflects the corresponding temperature at the sensing end.

Figure 2:
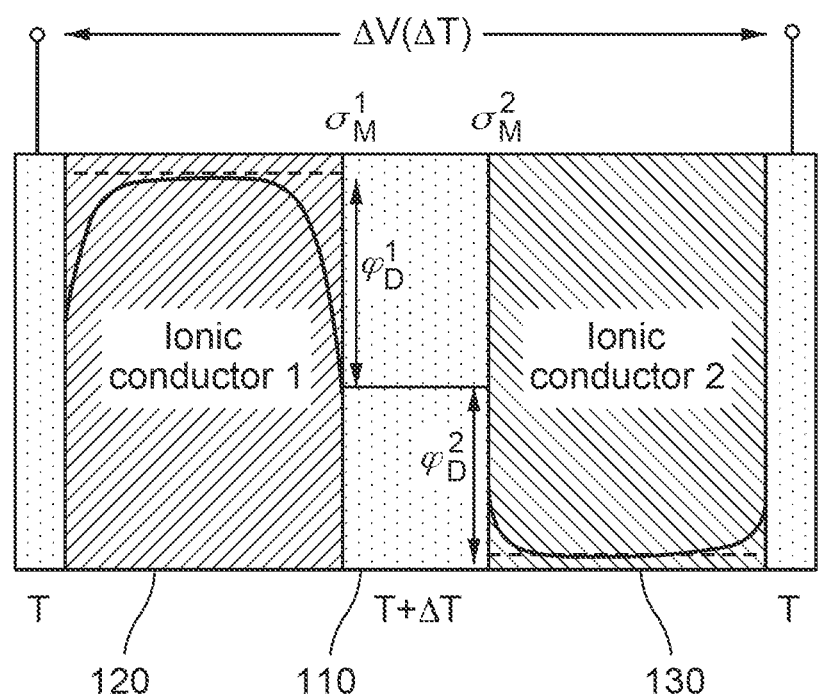
FIG. 2 is a schematic illustration of the potential drops for the asymmetric EDLs at the sensing end of an electrical double layer based elastomeric temperature sensor according to one or more embodiments.

Schematic potential drops for the asymmetric EDLs at the sensing end 190 are shown in FIG. 2, where elements are labeled as shown in FIG. 1. At the sensing end, two ionic conductors 120, 130 loaded with the same salt but different ion concentrations sandwich an electronic conductor 110. The voltage drops $\varphi_0^1$ and $\varphi_0^2$ at the interfaces result from the formation of the two asymmetric EDLs, respectively $\sigma_M^1$ and $\sigma_M^2$ are the surface charge densities at the two interfaces, respectively, determined by the electronic conductor, salt type and its concentration in ionic conductors. Similarly, another two EDLs form at the open end (not shown), leading to corresponding voltage drops. Since only the temperature at the sensing end changes, the temperature-dependent voltage change is only related to the temperature change at the sensing end.

The EDL-based sensing end generates electrical signal by temperature change. The ionic conductor serves as a stretchable and transparent interconnect to transmit electrical signals. Here, the ionic conductors are used for both temperature sensing and signal transmission. However, there is no requirement of proximity between the sensing end and open ends of the device. Thus, it is possible to remotely locate the sensing end, allowing for flexible testing environments. In addition, it increases the ease of maintaining the open end EDLs at fixed temperatures.

To investigate the temperature sensing capabilities of the temperature sensor according to one or more embodiments, a hot plate can be used to change temperature at the sensing end. In one or more embodiments, the hot plate is a point-heating plate, so that only a very small area at the sensing end is heated. In one or more embodiments, the sensing end can be separated from the open end by a distance that spaces the open end apart from temperature changes that might be occurring at the sensing end. In other embodiments, the thickness of the device is less than the length of the device. Since the thickness of the device is much smaller than its length, the heat transfer along the thickness direction is much faster than it along the length direction, so that the temperature change at the open end can be neglected. In other embodiments, the open end can be thermally insulated to maintain a constant temperature. In the examples described herein, a plastic disk (centimeter-thick) is inserted between the open end and the hot plate to thermally insulate. Longer ionic cable lengths permit a more localized temperature measurement. At the open end of the temperature sensor, the two ionic conductors are connected through two electronic conductors to an external circuit for signal measurement. Two additional layers of dielectric are used to seal the device. Both the ionic conductors and the dielectric can be stretchable and transparent. When there is a temperature difference $\Delta T$ between the sensing end and the open end, the output voltage between the two electronic-conductor connectors varies as $\Delta V$, which is linearly proportional to the temperature difference. In particular embodiments, the sensing materials generate voltage signal in measurement, thus no external power supplier is required.

When an electronic conductor and an electrolyte contact each other, a stable EDL forms at the interface and a potential is set up across the interface. According to the classic Gouy-Chapman model, the EDL voltage $\varphi$ can be given by $$\varphi = \varphi_0 \exp\left(-\frac{x}{L}\right),$$

where $\varphi_0$ is the potential at the interface relative to that in the bulk solution and L the Debye length. As the Debye length is temperature-related, the EDL voltage is temperature-dependent. Since the temperature at the open end is fixed, the thermal-induced output voltage variation $\Delta V(\Delta T)$ can be further written as $$\Delta V(\Delta T) = |\varphi_0^1 - \varphi_0^2| = \left| \frac{\sigma_M^1}{\varepsilon} \sqrt{\frac{\varepsilon k \Delta T}{2c_1 N_A v^2 e^2}} - \frac{\sigma_M^2}{\varepsilon} \sqrt{\frac{\varepsilon k \Delta T}{2c_2 N_A v^2 e^2}} \right|,$$

where $\varphi_0^1$ and $\varphi_0^2$ are the potential difference between the interface and the bulk solution for the two EDLs, respectively, $\sigma_M^1$ and $\sigma_M^2$ the surface charge densities on the side of the two electronic conductors at the interface, respectively, e the dielectric constant, k the Boltzmann constant, $c_1$ and $c_2$ the ion concentrations of the two ionic conductors, respectively, $N_A$ the Avogadro constant, v the valence of ions and e the elementary charge. It is assumed the EDL voltage is the potential difference between the interface and the bulk solution, i.e., $\varphi_0$. When the two ionic conductors are loaded with the same ion concentration, i.e., $c_1 = c_2$ and $\sigma_M^1 = \sigma_M^2$, the EDL voltages will cancel out. Therefore, the asymmetry in EDLs introduced by different ion concentrations in the two ionic conductors is necessary for temperature sensing. When $c_2 \gg c_1$, the second term in the above expression can be neglected and the expression can be simplified as $$\Delta V(\Delta T) = \frac{\sigma_M^1}{\varepsilon} \sqrt{\frac{\varepsilon k \Delta T}{2c_1 N_A v^2 e^2}},$$

showing that the temperature-dependent voltage change $\Delta V$ is linearly proportional to the temperature difference $\Delta T$ in a specific temperature range.

The ionic layer includes a medium suitable for the transport of ions, such as an electrolyte. In one or more embodiments, the ionically conductive medium is an aqueous salt solution. Any water soluble salt can be used; however, sodium chloride is a readily available, inexpensive source of ions. Other non-limiting examples of salts include lithium chloride and potassium chloride. In other embodiments, non-aqueous medium can be used to form the ionically conductive medium. Salt concentration can vary over a wide range without affecting the function of the electrode. Salt concentrations near saturation show the lowest possible resistances (e.g., highest conductivities). In principle, any electrolyte with any type of ion will work.

For elastomeric temperature sensors having two EDLs at the temperature sensing end, there is an ion concentration difference between the two ionic conductors. For concentration range, it has been found that the concentration in at least one ionic conductor desirably is dilute (~0.01 mol/L or lower). Different ion concentrations give different sensitivities. For applications where biocompatibility of the hydrogel layer is important, salt concentration that are isotonic to cells can be used, especially in the actuator application. Ion type, size and charge may also be considered when selecting an electrolyte salt. In one or more embodiments, the salt is selected for affinity to the interface surface with the electrode. In one or more embodiments, the ion size and charge can be selected for a desired charge density that can facilitate assembly at the EDL interface.

In one or more embodiments, the electrolyte is supported by a polymer elastomeric network. In one or more embodiments, the polymer network can be transparent. In one or more embodiments, the ionic layer is transparent. An appropriate choice of polymer elastomeric network produces a stretchable, fully transparent, elastomeric ionically conductive electrode. In one or more embodiments the elastomeric ionically conductive electrode is a hydrogel. Hydrogels refer to materials that are able to take up and hold large volumes of water. Due to the large volume of water in the hydrogel network, the gels can exhibit high degrees of transparency. Hydrogels generally consists of a three-dimensional polymer network that is crosslinked chemically and/or physically. The chemical properties of hydrogels are typically determined by the polymer backbone, any functional side chains on the monomer units and the crosslinking agent. The physical properties, for example, mechanical strength and swelling ratio, are controlled typically by the crosslink density. Thus, hydrogels of extremely high transparency and suitable mechanical strength can be used. In exemplary embodiments, polyacrylic acid, poly N-isopropylacrylamide (PNIPA), poly hydroxy ethyl methacrylate (PHEMA), poly ethylenene glycol (PEG), polyvinylalcohol (PVA), and/or acrylamide can be used as the base material for the hydrogel. Highly stretchable and tough hydrogels made from ionically crosslinked alginate, and covalently crosslinked polyacrylamide can also be used. In other instances, transparent, elastomeric and tough hydrogels from poly(ethylene glycol) can be made from PEG that has been covalently cross-linked through photopolymerization. A hydrogel containing slidering polymers, e.g., polymer networks threading polymer chains through polycyclic linkers, can be stretched to more than 10 times its initial length; a tetra-poly(ethylene glycol) gel has a strength of ~2.6 MPa. These gels deform elastically. A gel can be made tough and notch-insensitive by introducing energy-dissipating mechanisms. For example, a fracture energy of ~10,000 J-m-2 is achieved with a double-network gel, in which two networks—one with short chains, and the other with long chains—are separately crosslinked by covalent bonds. Further details on the preparation of elastomeric hydrogels can be found in "Highly stretchable and tough hydrogels" Sun et al. Nature (489) 133 (Sep. 6, 2012), which is incorporated by reference. In one or more embodiments, hydrogel layers with a thickness in the range of 5 µm-1000 µm can be employed. Exemplary single layer devices can employ layers on the order of 100 µm. In multilayer devices, lower thicknesses will be beneficial, probably in the order of 10 µm or even less.

In other embodiments, tough hydrogels can also be employed for the ionic conductors.

One advantage of the ionic layer is that the generated voltages in the temperature sensing are not adversely affected by stretching. Because the conductive framework of the hydrogel is an aqueous electrolyte solution, the electrolyte has the ability to flow within the hydrogel network. When the system is actuated and the electrolyte layers are stretched, the electrolyte solution can redistribute within the hydrogel network without disruption of the connectivity and conductivity of the electrolyte. In other embodiments, the hydrogel electrodes feature transmittance near 100% at any deformation state.

The electronic conductors for both the sensor end and open end can be any electronic conductor. Exemplary electrodes include gold, platinum, silver, or any other metal. Also, possible electronic conductors are based on carbon, such as carbon grease, carbon particle impregnated elastomers, carbon fibers, carbon nanotube, graphene etc. The electronic conductor can be used in a variety of form factors, such as in the form of thin films, sheets, fabrics, meshes and the like. Exemplary electronic conductors can be electrochemically inert in the presence of the electrolyte. In some embodiments, the electronic conductor can be stretchable, flexible, elastic, and/or transparent. A few examples are following. Conducting polymer, such as PEDOT (Poly(3,4-ethylenedioxythiophene)), PEDOT:PSS (Poly(3,4-ethylene-dioxythiophene)-poly(styrenesulfonate)) and carbon-based conductive polymer such as powder of carbon, carbon nanotube or grapheme embedded in PDMS. However, since the conductor can be small, it is not required to be stretchable, flexible, or transparent. The electrode can be non-elastic and/or non-transparent without affecting the overall stretchability and transparency of the temperature sensor. In one or more embodiments, the electronic conductor can be multilayered and can include an outer protective layer. There are no limitations with respect to thickness and other geometric parameters of the electronically conducting electrode. The overlapping area between electronic conductor and ionic conductor, i.e., the EDL area, will not affect the sensor performance. The electronic conductor can always be any shape as long as there is contact. If the adhesion between the electronic conductor and the ionic conductors is good enough, the electronic conductor can be stretched much more.

Any material having a sufficiently high dielectric strength may be used as the dielectric layer. The insulating properties of the layer play a role in the device performance, especially in the actuator application. While not required to be elastomeric or transparent in order to be used in the practice of the invention, the use of such transparent, elastomeric materials provides a transparent and stretchable sensing system. Exemplary elastomer includes a silicone rubber, an acrylonitrile-butadiene rubber (NBR), a hydrogenated acrylonitrile-butadiene rubber (H-NBR), an ethylene-propylene-diene rubber (EPDM), an acrylic rubber, a urethane rubber, an epichlorohydrin rubber, a chlorosulfonated polyethylene, and a chlorinated polyethylene. The common material in the actuator application is VHB 4910. Exemplary transparent dielectrics include PDMS, also acrylic rubbers. Additional suitable dielectric elastomers are described in Journal of Polymer Science, Part B: Polymer Physics, 2013, 51, 197-206, which is incorporated in its entirety by reference. Suitable thickness can depend on the intended application. In a general circuit, there are no special requirements for the thickness. The higher the thickness, the lower the capacity, and the higher the maximum frequency. In the actuator application, typical thicknesses range from 10 µm to 1 mm. The thickness of the dielectric in the sensing part will influence the thermal response time. The thinner the dielectric, the faster the thermal response. Also, the thinner the ionic conductor, the faster the thermal response. The thickness of the dielectric in the cable part will influence the electric response time, i.e., RC delay. The thermal response is much slower than the electric response. If the thickness of dielectric can be reduced to the scale of 1 µm, the thermal response time will be shortened to the scale of 100 ms or less, comparable to thermocouple, the fastest-responding temperature sensor.

In other embodiments where the high flexibility and stretchability of elastomers is not required, other dielectric materials can be used. For example, piezoelectric polymers such as polyvinylidene difluoride (PVDF) can be used.

Figure 7A:
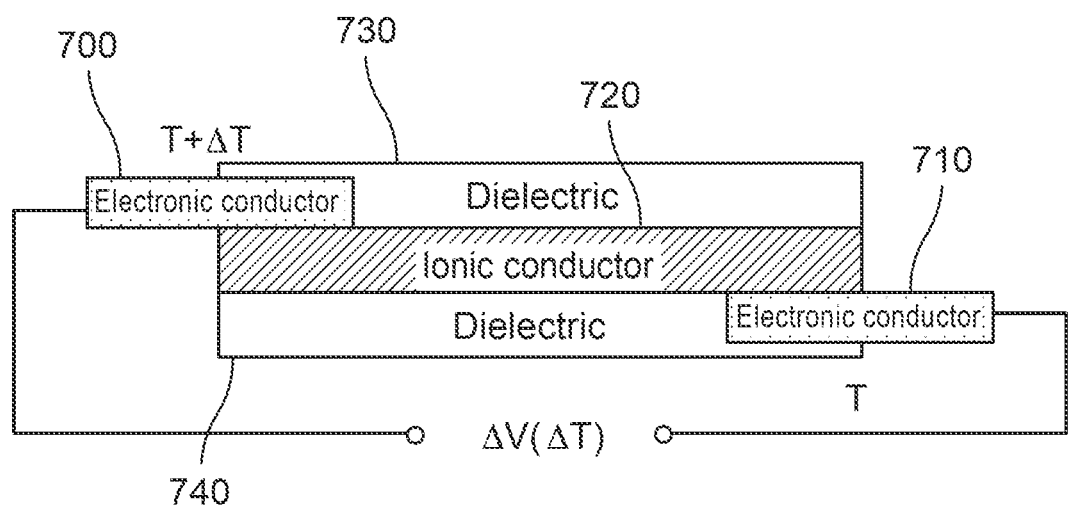
FIG. 7A is a schematic illustration of an alternative embodiment for an electrical double layer based elastomeric temperature sensor system according to one or more embodiments.

The transparent, elastomeric ionic electrode can be included in a variety of devices, giving rise to a variety of circuit arrangements. In one or more embodiments, a single EDL is employed in the sensing end. As shown in FIG. 7A, in one embodiment, two electronic conductors 700, 710 are placed at two ends of an ionic conductor 720. The two electronic conductors can be the same or different. EDLs form in the contact area of the electronic conductor and the ionic conductor at both ends that function as the sensing end and open end, respectively. The two electronic conductors are connected to external circuit for signal measurement. Two layers of dielectric 730, 740 are used to seal the device. Temperature at the sensing end is continuously varied, while that at the open end is fixed. Thus, voltage signals are generated and recorded. In this embodiment, there is no need to use a pair of asymmetric EDLS in the sensing end because only one EDL is formed at both ends.

Figure 7B:
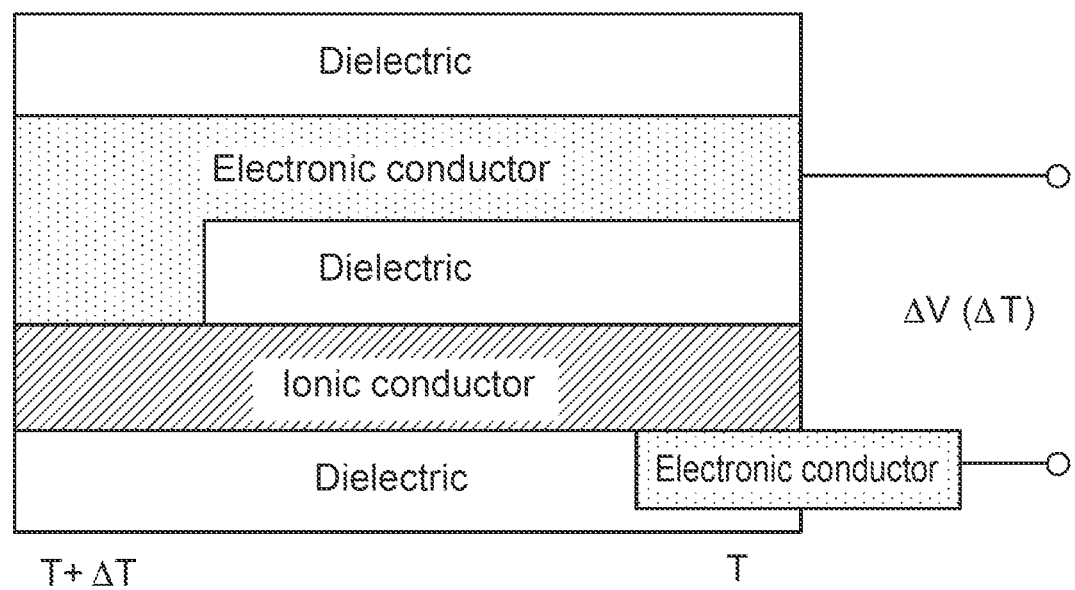
FIG. 7B is a schematic illustration of an alternative embodiment for an electrical double layer based elastomeric temperature sensor system according to one or more embodiments.
Figure 7C:
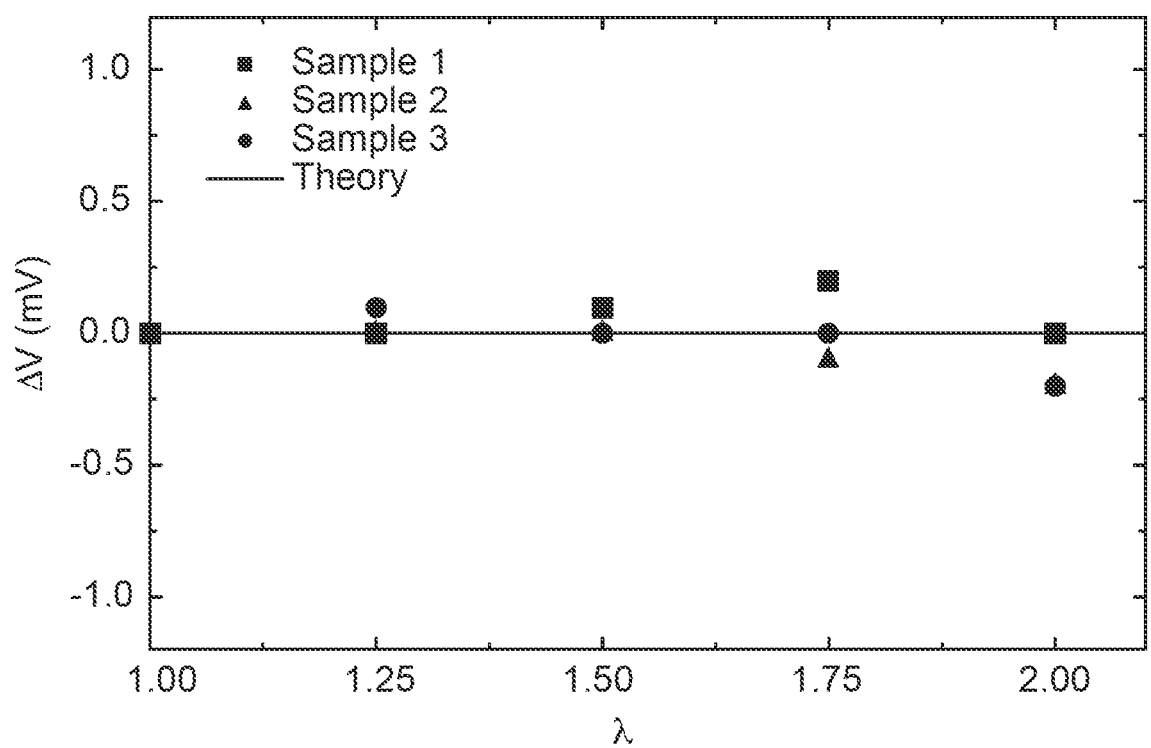
FIG. 7C is a plot of voltage change with temperature change in an electrical double layer based elastomeric temperature sensor system according to FIG. 7B, demonstrating performance with different stretches ($\lambda$), showing that the sensor is not affected by stretching.

In other embodiments, it may be desirable to have the two electronic conductors accessible to external contacts on the same side of the device. FIG. 7B is an illustration of an alternative embodiment of the temperature sensor that operates under the same principle as FIG. 7A. To be an effective stretchable temperature sensor, the electrical signal should be sensitive to temperature, but insensitive to stretch. One basic design for investigating the stretch effect places two electronic conductors and an ionic conductor in series is shown in FIG. 7B. A dielectric is inserted in the middle for insulation and another two dielectrics are used to seal the device. Two EDLs form at two electronic conductor/ionic conductor interfaces, respectively. When the temperature of one EDL changes and that of the other EDL is fixed as T, a corresponding voltage change $\Delta V$ can be generated and recorded. When the electronic conductor and ionic conductor are elastomeric, they are stretchable. The stretch λ, however, does not change the structure of the EDL, so that the voltage across EDL is insensitive to stretch. The change of voltage under various stretches is shown in FIG. 7C.

The temperature measurement of devices as illustrated in FIGS. 7A and 7B is described. In a first embodiment, it is assumed that the same electronic conductor is used for both EDLs. When the two ends have the same temperature, the two EDLs are identical, so that the voltage across them cancel, and $\Delta V=0$. When the temperature of one EDL changes and that of the other EDL is fixed as T, a corresponding voltage change $\Delta V=a \cdot \Delta T$ can be generated and recorded. In a second embodiment, different electronic conductors for the two EDLs and the corresponding voltage becomes $\Delta V=a_1(T+\Delta T+273)-a_2(T+273)=a_1(T+\Delta T)-a_2 T$. In this case, when the two ends have the same temperature, the voltage across the two different EDLs will not cancel, and $\Delta V=(a_1-a_2)T$. It needs to be excluded to ensure accuracy. Thus, the effective voltage is $\Delta V=a_1(T+\Delta T)-a_2 T-(a_1-a_2)T=a_1 \cdot \Delta T$. It indicates that for both cases, the voltage reflecting temperature only depends on the types and concentrations of ions, as well as on the type of electronic conductor at the sensing end.

Figure 8:
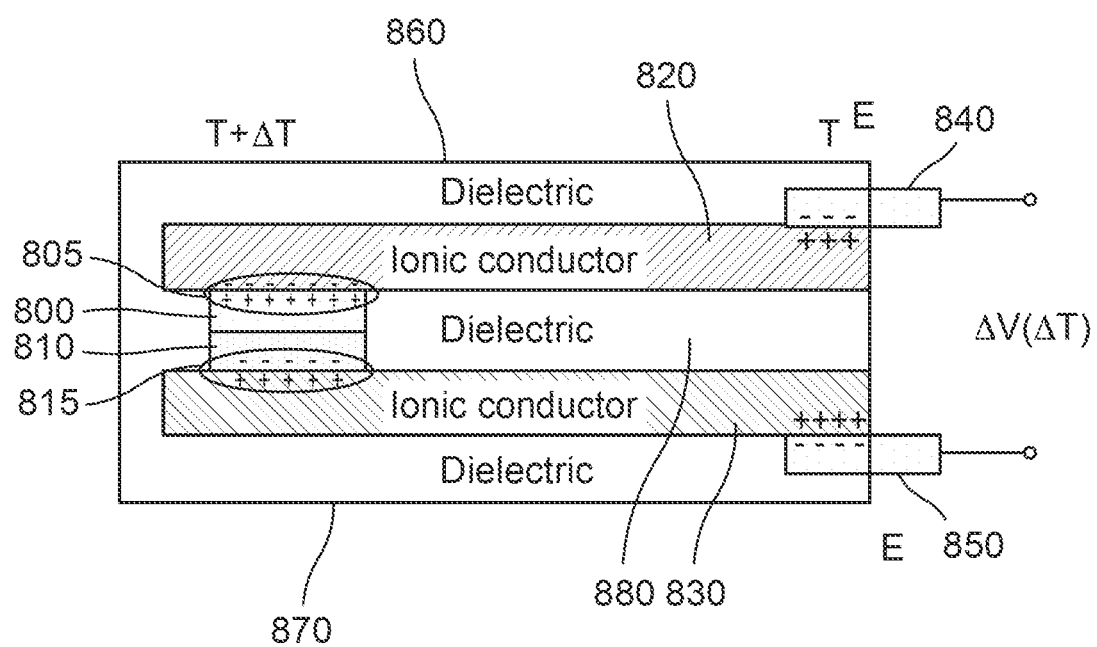
FIG. 8 is a schematic illustration of an alternative embodiment for an electrical double layer based elastomeric temperature sensor system according to one or more embodiments.

In one or more embodiments, two different electronic conductors can be used to create the EDLs in the sensing end. FIG. 8 is a schematic illustration of an EDL-based elastomeric temperature sensor in which two different electronic conductors 800, 810 are sandwiched by two ionic conductors 820, 830 as the sensing end to form two EDLs 805, 815, respectively. Since the two electronic conductors are different, the EDLs formed between each ionic conductor and its electronic conductor are different. A dielectric 880 is inserted between the two ionic conductor layers for insulation. Two electronic conductors 840, 850 are used to connect the two ionic conductors separately at the open end to external circuit for signal measurement. Two additional layers of dielectric 860, 870 are used to seal the device. In this design, temperature at the open end can be arbitrary (e.g., not fixed), because the two EDLs cancel out with each other. The two EDLs at the open end are the same (because the electronic conductors at the open end and ionic conductors are the same), but with inverse polarities. Since they are in series, they will cancel out with each other anyway. Therefore, the temperature at the open end does not matter. Thus, it is capable of absolute temperature measurement.

Figure 9:
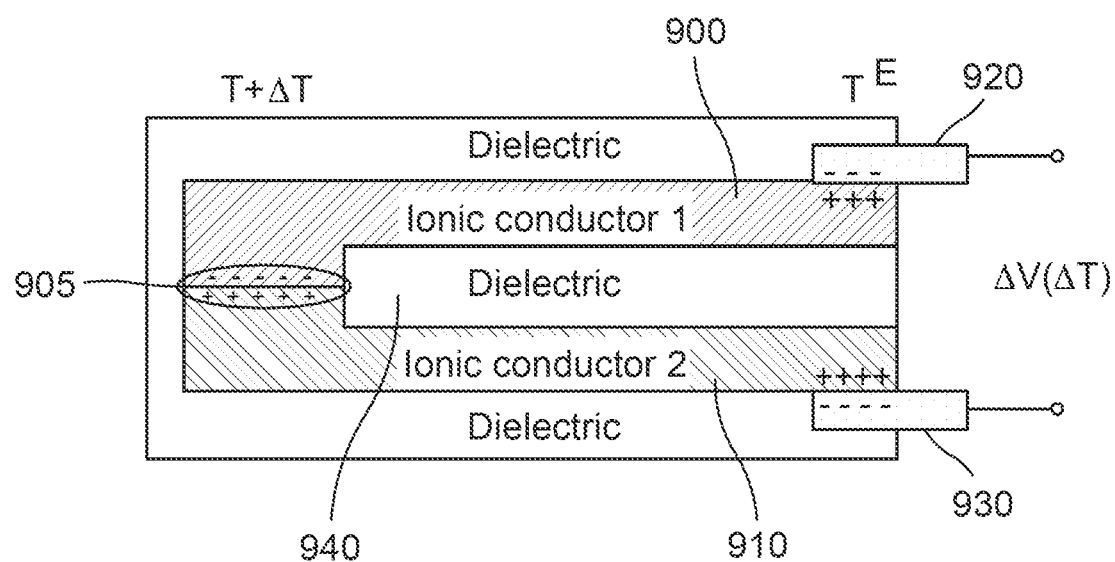
FIG. 9 is a schematic illustration of an alternative embodiment for an electrical double layer based elastomeric temperature sensor system according to one or more embodiments.

In one or more embodiments, two different ionic layers may form the EDL used for temperature sensing. FIG. 9 is a schematic illustration of an EDL-based elastomeric temperature sensor in which two immiscible ionic conductors 900, 910 are used to form an EDL 905 as the sensing end. Two electronic conductors 920, 930 are used to connect the two ionic conductors separately at the open end to external circuit for signal measurement. In this case, since the two ionic layers are immiscible, ions do not diffuse into each other. Thus, a stable EDL will form at the interface. A dielectric layer 940 is used to isolate the two ionic layer in areas where the EDL is not present. Similar to the previous designs, this EDL voltage is also temperature-dependent. When temperature at the sensing end changes, this EDL voltage will change and generate corresponding signal. Again, the temperature at the open end is fixed.

Figure 10:
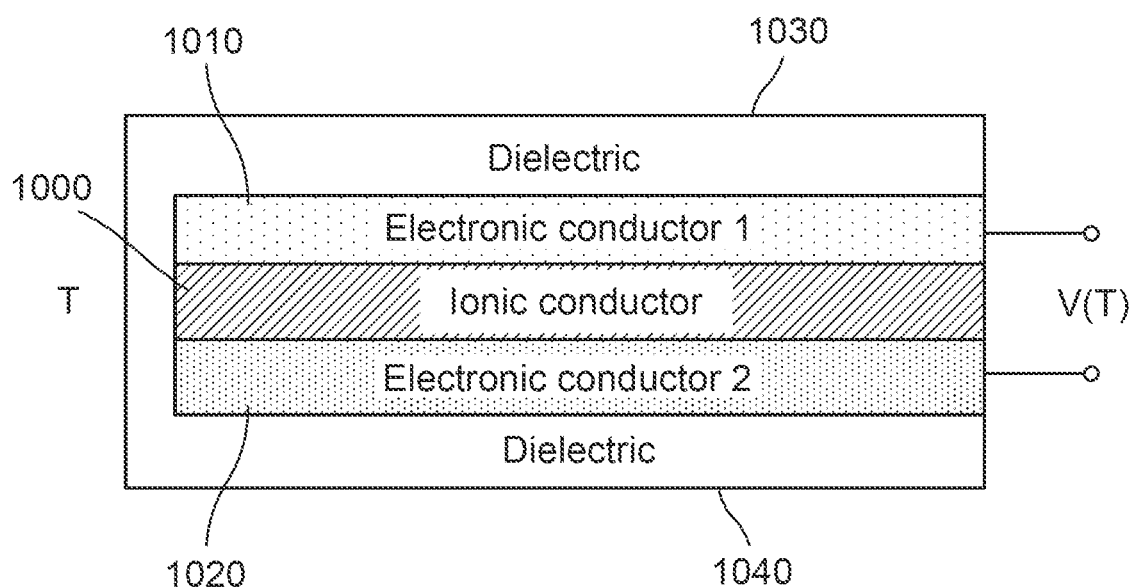
FIG. 10 is a schematic illustration of an alternative embodiment for an electrical double layer based elastomeric temperature sensor system according to one or more embodiments.

In one or more embodiments, an ionic conductor is sandwiched by two different electronic conductors. FIG. 10 is a schematic illustration of an EDL-based elastomeric temperature sensor in which a single ionic conductor 1000 is sandwiched by two different electronic conductors 1010, 1020. Two layers of dielectric 1030, 1040 are used for sealing. Two EDLs are formed on either side of the ionic conductor layer 1000. As described above in designs using two EDLs, asymmetry is introduced to avoid EDL voltages from canceling out. In this case, since the two electronic conductors are different, the EDLs formed between the ionic conductor and the two electronic conductors are asymmetric. When its temperature is uniformly increased, proportional voltage signals will be generated and captured. This design is capable of point temperature measurement. In this embodiment, there is no such 'open' end or 'sensing' end, since the temperature of the whole device will be uniformly changed. When the two EDLs are at the same temperature, their voltage will not cancel out and the overall voltage can reflect the temperature. Thus, this design can measure absolute temperature, and no temperature difference is required. In this embodiment, there is no EDL at the 'open' end.

Figure 11:
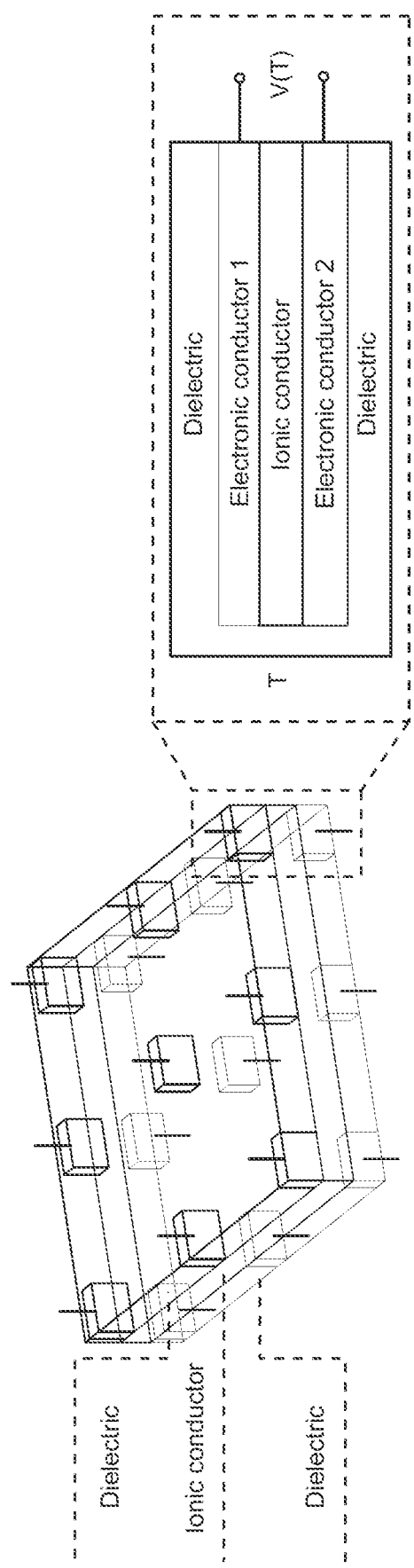
FIG. 11 is a schematic illustration of an alternative embodiment for an electrical double layer based elastomeric temperature sensor system according to one or more embodiments.

In other embodiments, a temperature sensor network can be composed of multiple unit cells. FIG. 11 is a schematic illustration of an EDL-based elastomeric temperature sensor network in which each unit cell has the same structure as described in FIG. 10. Hence, this sensor network enables multipoint, large-area, conformal temperature measurement.

The EDL based elastomeric temperature sensor is capable of conformal temperature measurement for unusual curved configurations, and requiring no external power supplier. Stretchable and transparent ionic conductors serve not only for signal transmission, but also for sensing. Temperature is captured through the EDL voltage that is insensitive to deformation. Further, the EDL-based working principle has been verified and is consistent with the experimental result. The elastomeric temperature sensor is cost effective and easy to fabricate. The EDL based elastomeric temperature sensor shows potential in stretchable electronics, health care and soft robots as a stretchable temperature sensor.

An elastomeric temperature sensor according to one or more embodiments demonstrates many advantages over convention temperature sensors, such as RTDs, thermistors and thermocouples, as is summarized in the table below. It is evaluated in terms of several key parameters. An elastomeric temperature sensor surpasses conventional resistance temperature detector (RTD), thermistor, and thermocouple in terms of sensitivity, resolution, response time, linearity, cost, and application. The resolution of an elastomeric temperature sensor, in particular, can achieve 0.001° C., higher than other conventional thermometers, as its sensitivity is 1.24 mV/° C., 100 times that of thermocouple whose resolution is 0.1° C., already the highest among the commercial products. Also, the elastomeric temperature sensor's thermal response time can be as little as less than 100 ms—comparable to thermocouple, the fastest-responding temperature sensor—when its thickness is reduced to microns. Further, the elastomeric temperature sensor is one of the best-performing in terms of linearity, another important parameter in real measurement. Moreover, the elastomeric temperature sensor is more cost-effective not only because of the lower cost of the material, but also the simpler circuitry compared with the other conventional options. Finally, the sensor is applicable to both general and unusual scenarios, as well as temperature measurement from point to large area. The sensor also has unique advantages in softness, stretchability and transparency.

|  | RTD | Thermistor | Thermocouple | Sensor of the invention |
| --- | --- | --- | --- | --- |
| Material | Metal (Pt, Ni) | Metal oxide | Metal | Elastomer |
| Working principle | Resistance | Resistance | Seebeck effect | EDL |
| Sensitivity | 0.385Ω/° C. | 200Ω/° C. | ~10 µV/° C. | ~1 mV/° C. |
| Resolution | 0.05° C. | 0.02° C. | 0.1° C. | 0.001° C. |
| Signal-to-noise ratio | Excellent | Good | Poor | Excellent |
| Response time | 1~7 s | 6~14 s | ≤100 ms | ≤100 ms |
| Linearity | Good | Poor | Fair | Good |
| Cost | Most expensive | Very inexpensive | Less expensive | Most inexpensive |
| Circuitry | Complicated | Simple | Complicated | Very simple |
| Size | Small to medium | Point to small | Very small to very large | Point to very large |
| Application | General | Medical & point sensing | High temperature | General & unusual |
| Softness | Hard | Hard | Hard | Soft |
| Stretchability/Flexibility | No | No | No | Yes |
| Transparency | No | No | No | Yes |

The invention is described with reference to the following examples, which are presented for the purpose of illustration only and are not intended to be limiting of the invention.

EXAMPLES

Synthesis of NaCl-containing Polyacrylamide Hydrogel:

Acrylamide (AAm) monomer powder and NaCl powder (0.003 mol/L, 0.03 mol/L, 2 mol/L and 4 mol/L) were dissolved in the deionized water. AAm was then crosslinked by the crosslinker N,N'-methylenebisacrylamide (MBAA, 0.05% the weight of AAm). N,N,N',N'-tetramethylenediamine (TEMED, 0.05% the weight of AAm) and ammonium persulfate (APS, 0.17% the weight of AAm) were added as catalyst and initiator, respectively. The solutions were poured into laser cutting-made 0.5 mm-thick plastic molds glued on the glass substrate. A second glass sheet was used to seal the molds, where the solutions gelled.

Fabrication of the Elastomeric Temperature Sensor:

The synthesized NaCl-containing polyacrylamide hydrogel and VHB were cut by using UNIVERSAL laser cutter with predesigned shapes. The conductive fabric with a rectangular shape was symmetrically attached on the top and bottom surfaces at one end of the VHB insulation layer. After that, gold sputtered on polyethylene terephthalate with a precut shape and NaCl-containing polyacrylamide hydrogel with one concentration were placed on the bottom layer of VHB sequentially. A similar step was made to the top layer of VHB but using polyacrylamide hydrogel with another NaCl concentration. Further, these two VHB layers were symmetrically placed on the top and bottom surfaces of the middle VHB layer, where the hydrogel ends without gold were symmetrically contacted the conductive fabric to form asymmetric electrical double layers. In the end, the device was connected to a voltmeter through the gold sputtered on polyethylene terephthalate.

Measurements:

The sensing end of the temperature sensor was placed on a commercial point-heating hot plate (VWR Hotplate/Stirrer) and the open end connected to a voltmeter was placed in open air. The sensing end was heated and the temperature at the open end was fixed at room temperature. A commercial resistive thermometer was placed on top of the sensing end of the temperature sensor to monitor its temperature. 5 minutes after the temperature reached a stable level, the corresponding voltage at each temperature level at the sensing end was captured through a voltmeter.

Multiple samples with various electronic conductors at the sensing end and ion concentrations of the ionic conductors were prepared. Polyacrylamide hydrogels (500 µm thickness) loaded with different concentrations of sodium chloride (NaCl) were used as ionic conductors, and gold (30 nm thickness) sputtered on polyethylene terephthalate films (100 µm thickness) were used as the electronic conductors connecting the open end to a voltmeter (Fluke 8846A). Inert gold electrodes were employed to avoid electrochemical reactions. Stretchable and transparent 3M VHB 4905 (500 µm thickness) was used as the dielectric for insulation and sealing. To demonstrate temperature sensing of the device, the sensing end of the temperature sensor was placed on the center of a commercial point-heating hot plate (VWR Hotplate/Stirrer). The open end was placed in air so that its temperature can be fixed at room temperature. During measurement, the temperature at the sensing end was continuously increased with ~5° C. interval and monitored through a commercial resistive thermometer (Supco Logit Pressure & Temperature Data Logger). The corresponding output voltage was recorded 5 minutes after the thermometer reading reached each stable level.

In a first evaluation, the effectiveness of different electronic conductors was assessed. Different electronic conductors, e.g., conductive fabric, carbon grease and gold coated copper, were experimentally studied with a specific NaCl concentration combination in the two ionic conductors, i.e., 0.03 mol/L and 2 mol/L. The change in voltage with change in temperature is plotted in FIG. 3B. The performance for all conductors is linear even if different electronic conductors were chosen. The sensor with gold coated on copper has high sensitivity, e.g., the ΔV/ΔT slope is steep, but was limited by conformability and stretchability. In addition, pinholes in the gold coating in this particular example resulted in the copper being in direct contact with the NaCl-containing hydrogels where corrosion happens. Thus, care to provide defect free protective coatings is to be considered when using reactive metals as stability and reliability may become issues. As a comparison, carbon grease, a popular stretchable conductor enables stretchable and conformal temperature sensing, but the sensitivity is much lower, e.g., lower ΔV/ΔT slope. Since carbon grease has poor adhesion with hydrogels, it may flow and result in delamination at high temperature and large deformation, leading to ineffective sensor performance. Among three electronic conductors, the conductive fabric possesses the attributes of high sensitivity and stretchability, enabling a soft and stretchable temperature sensor. The conductive fabric was obtained from Sparkfun Electronics MedTex130. It is silver-plated nylon, highly stretchable in one direction, and highly conductive with a surface resistivity of less than 1 Ω/sq. The conductive fabric is composed of 78% nylon and 22% elastomer. An exemplary elastomeric temperature sensor using conductive fabric is soft and stretchable. Except for the sensing end, it is also transparent. The conductive fabric is a preferred electronic conductor where high stretchability and sensitivity are desired.

The elastomeric temperature sensor performance with various NaCl concentrations in the ionic conductors was also investigated. As explained above, elastomeric temperature sensors in which the two ionic conductors have the same salt concentration are not expected to show a difference in voltage with temperature. The current investigation confirms that as long as the two ionic conductors have the same ion concentrations (0.003 mol/L, 0.03 mol/L and 2 mol/L, respectively), there will be negligible signal variations to reflect temperature change. When the concentrations in the two ionic conductors are identical (i.e., symmetric), there is no signal. Thus, the asymmetric EDLs in the current design provide important information on temperature, and the sensitivity is tunable.

Subsequent experiments used polyacrylamide hydrogels with 0.03 mol/L and 2 mol/L NaCl concentrations as ionic conductors to study the proposed elastomeric temperature sensor performance. Physically, the temperature dependence of EDL voltage originates from the temperature-related Debye length. According to the expression of the Debye length, the higher ion concentration, the smaller the Debye length. For concentrated solution (2 mol/L in our case), the Debye length is too small to be influenced by temperature change. That is why the performance is dominated by the EDL between the electronic conductor and the ionic conductor with dilute ion concentration. In another example, a sensor with sensors with 0.003 mol/L and 0.03 mol/L NaCl loading ionic conductors (a 10-fold difference in concentration) were tested with similar results. We chose 0.03-2 mol/L because the 2 mol/L end can be neglected, which is more straightforward both experimentally and theoretically.

Figure 4A:
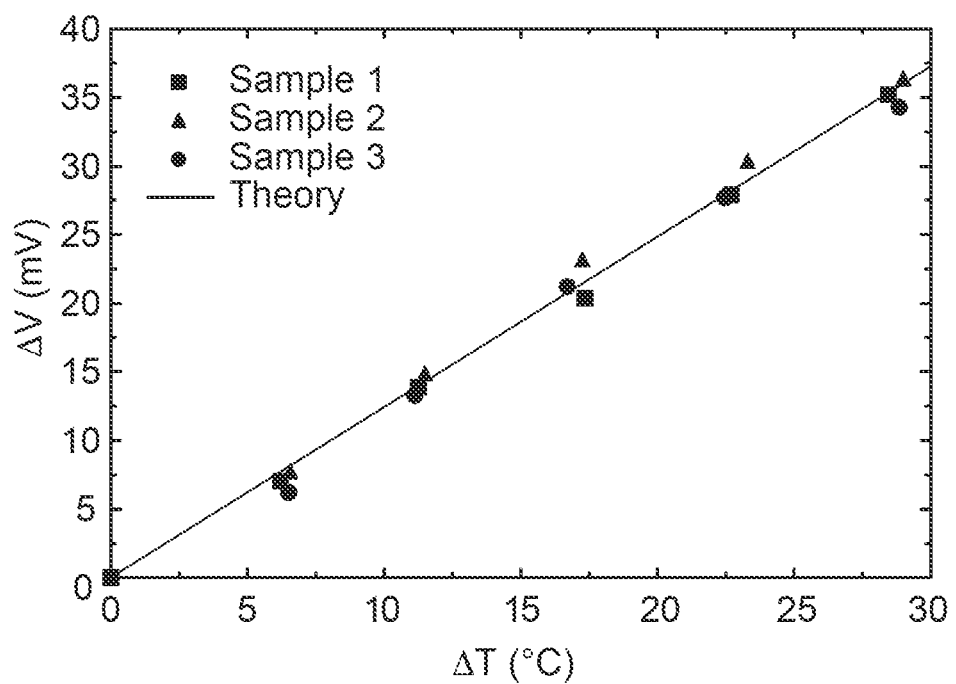
FIG. 4A is a plot of voltage change with temperature change in an electrical double layer based elastomeric temperature sensor system for which a silver-plated nylon is used as the electronic layer for the sensing end according to one or more embodiments, demonstrating voltage change ($\Delta V$) increases linearly with the temperature change ($\Delta T$). The sensitivity $\Delta V/\Delta T$ is about 1.24 mV/° C. The experimental results are consistent with the theoretical prediction.

The consistency, response time and stability of the elastomeric temperature sensor were also evaluated using a conductive fabric conductor and polyacrylamide hydrogels with 0.03 mol/L and 2 mol/L NaCl concentrations as ionic conductors. The overall performance of 6 samples was studied and the voltage change $\Delta V$ derived from 3 samples is almost linearly proportional to the temperature difference $\Delta T$ as shown in FIG. 4A. The experimental results indicate consistency of performance among 3 samples with tolerable errors. In this case, the concentration of one ionic conductor (2 mol/L) is much larger than that of the other ionic conductor (0.03 mol/L) and the Debye length of the 2 mol/L EDL is too small to be influenced by temperature change. As a result, the contribution to EDL voltage made by the ionic conductor with 2 mol/L NaCl can be neglected and the theoretical expression can be simplified as $$\Delta V = \frac{\sigma_M^1}{\varepsilon} \sqrt{\frac{\varepsilon k (\Delta T + 273.15)}{2 c_1 N_A v^2 e^2}} - \frac{\sigma_M^1}{\varepsilon} \sqrt{\frac{273.15 \varepsilon k}{2 c_1 N_A v^2 e^2}},$$

where $\varepsilon = 78.49 \times 8.85 \times 10^{-12}$, $k = 1.38 \times 10^{-23}$ m²·kg/(s²·K), $c_1 = 0.03$ mol/L, $N_A = 6.02 \times 10^{23}$ mol⁻¹, $v=1$, $e=1.6 \times 10^{-19}$ C and $\sigma_M \sim 10^{-2}$ C/m². The expression can be simplified to $\Delta V = \sqrt{2148.5(\Delta T + 273.15)} - \sqrt{2148.5 \times 273.15}$. Plotting this curve as shown in FIG. 4A demonstrates consistency with the experimental measurements.

Figure 4B:
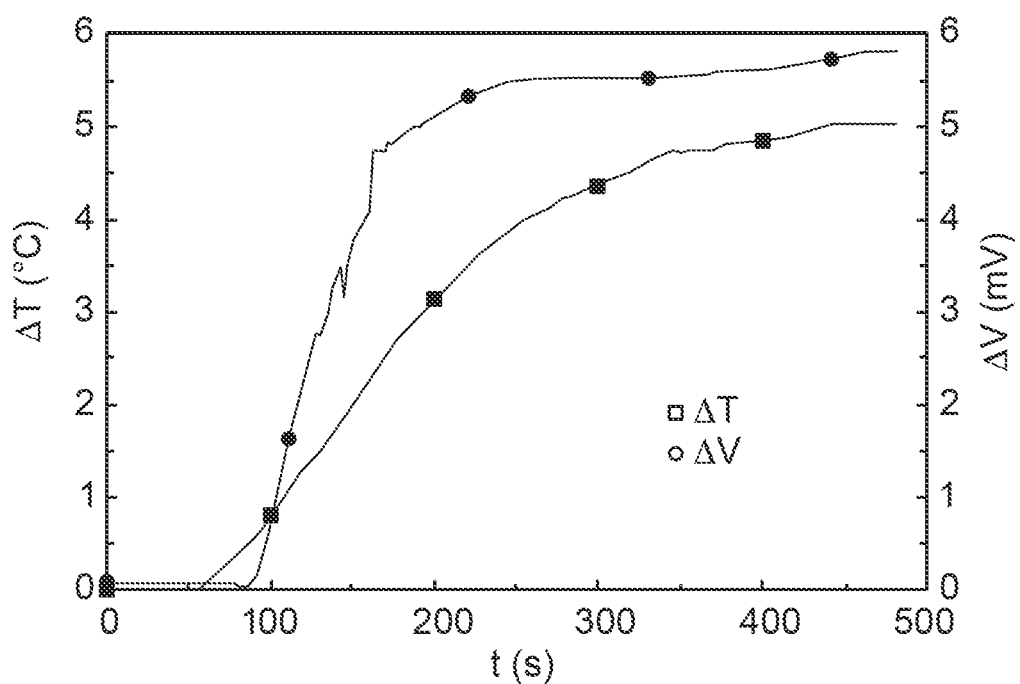
FIG. 4B is a plot of temperature change (left) and voltage change (right) with time in an electrical double layer based elastomeric temperature sensor system for which a silver-plated nylon is used as the electronic layer for the sensing end, according to one or more embodiments.

In other examples, the thermal response of the elastomeric temperature sensor was evaluated. As shown in FIG. 4B, for a given sensor, voltage increases about 6 mV corresponding to 5° C. temperature difference between the sensing end and the open end. Once the temperature reaches a stable level, the correspondence voltage does not change further. Since the sensor is heated by the hotplate from below, the time response delay represents the time it takes for the upper surface to reach the same temperatures as the lower surface. The thermal response time is about 400 s. The heat transfer primarily occurs by convection. According to Newton's law of cooling, lost heat Q can be expressed by $Q = \theta A \Delta T$, where $\theta$ is the coefficient of convective heat transfer, A the surface area and $\Delta T$ the temperature difference. Applying the first law of thermodynamics, we can obtain $\theta A \Delta T \cdot t = m C_h \Delta T$, where m is the mass and $C_h$ the specific heat capacity. Thus, the thermal response time can be given by $$t_{thermal} = \frac{m C_h}{\theta A} = \frac{\rho_m C_h d}{\theta},$$

where $\rho_m$ is the mass density and d the thickness. We assume VHB and PDMS have similar thermal properties. Thus, by plugging numbers into the equation $\rho_{m\ hydrogel} = 1 \times 10^3$ kg/m³, $\rho_{m\ VHB} = 960$ kg/m³, $C_{h\ hydrogel} = 4.2 \times 10^3$ J/(kg° C.), $C_{h\ PDMS} = 1.46 \times 10^3$ J/(kg° C.), $d_{hydrogel} = d_{VHB} = 1 \times 10^{-3}$ m, $\theta_{hydrogel} \approx 10$ W/(m²° C.) and $\theta_{PDMS} = 916$ W/(m²° C.), $t_{thermal} = t_{thermal\ hydrogel} + t_{thermal\ VHB} \approx 421.5$ s, which is consistent with the experimental result. In the above calculation, $t_{thermal\ hydrogel} \approx 420$ s $\gg t_{terhaml\ VHB} \approx 1.5$ s, indicating that thermal delay is dominated by the hydrogel. Thermal response time can be shortened by reducing the device thickness.

To evaluate the electrical response time, the RC delay from the interconnect is determined. The resistance of hydrogel R can be calculated using the equation $$R = \frac{\rho l}{s} \sim \frac{10^{-1} \cdot 10^{-1}}{10^{-5}} = 1000\ \Omega,$$

where $\rho$ is resistivity l the length and s the cross-sectional area. The capacitance of the VHB C dielectric can be calculated by $$C = \frac{\varepsilon_{VHB} A}{d} \sim \frac{10^{-11} \cdot 10^{-3}}{10^{-3}} = 10^{-11}\ F.,$$

where $\varepsilon_{VHB}$ is the VHB permittivity, A the area and d the thickness. Thus, the electrical response time $t_{RC}$ can be given by $t_{RC} = RC = 10^{-8}$ s, which is much smaller than the thermal response time, suggesting that the electric delay is shorter than thermal delay.

Figure 4C:
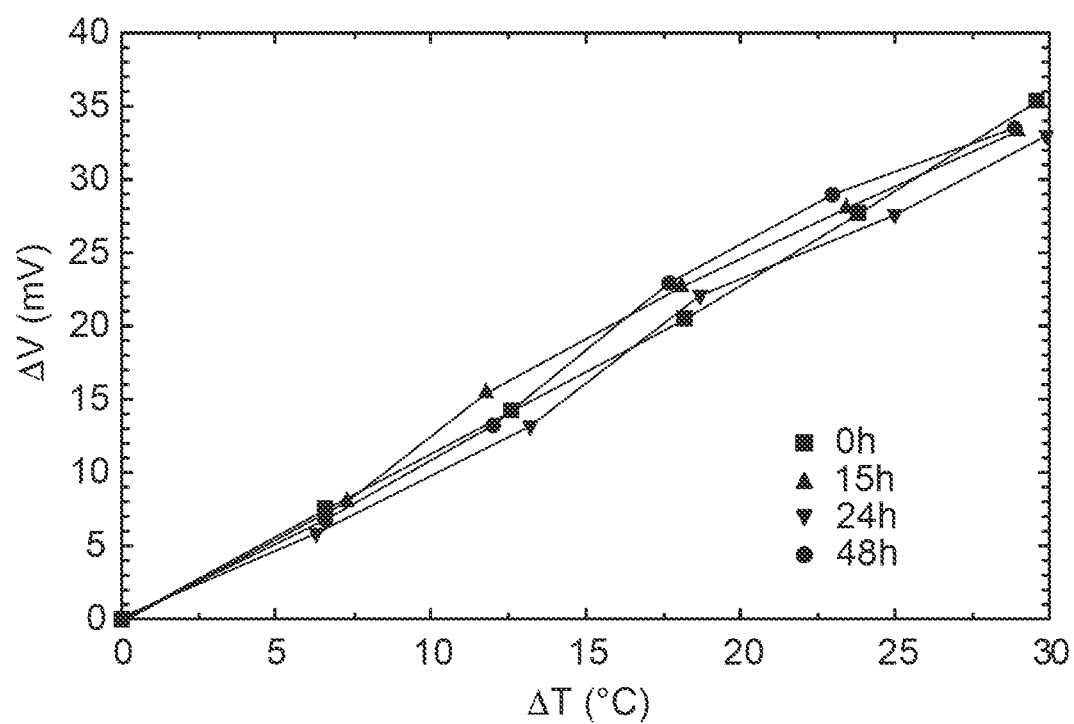
FIG. 4C is a plot of voltage change with temperature change in an electrical double layer based elastomeric temperature sensor system according to one or more embodiments tested at 0 hour, 24 hours, and 48 hours after it was made, showing that the sensor is quite stable and can be used for a long time.

To evaluate the stability of the elastomeric temperature sensor, a sample was tested at different times, e.g., 0 hour, 24 hours, and 48 hours, after fabrication. The results in FIG. 4C show that the elastomeric temperature sensors perform consistently over time, and suggesting that evaporation of electrolyte solvent does not degrade sensor performance. In order to reduce the possible effects of solvent evaporation, a more hydroscopic salt, such as LiCl can be used, or ionogels could be used.

Figure 4D:
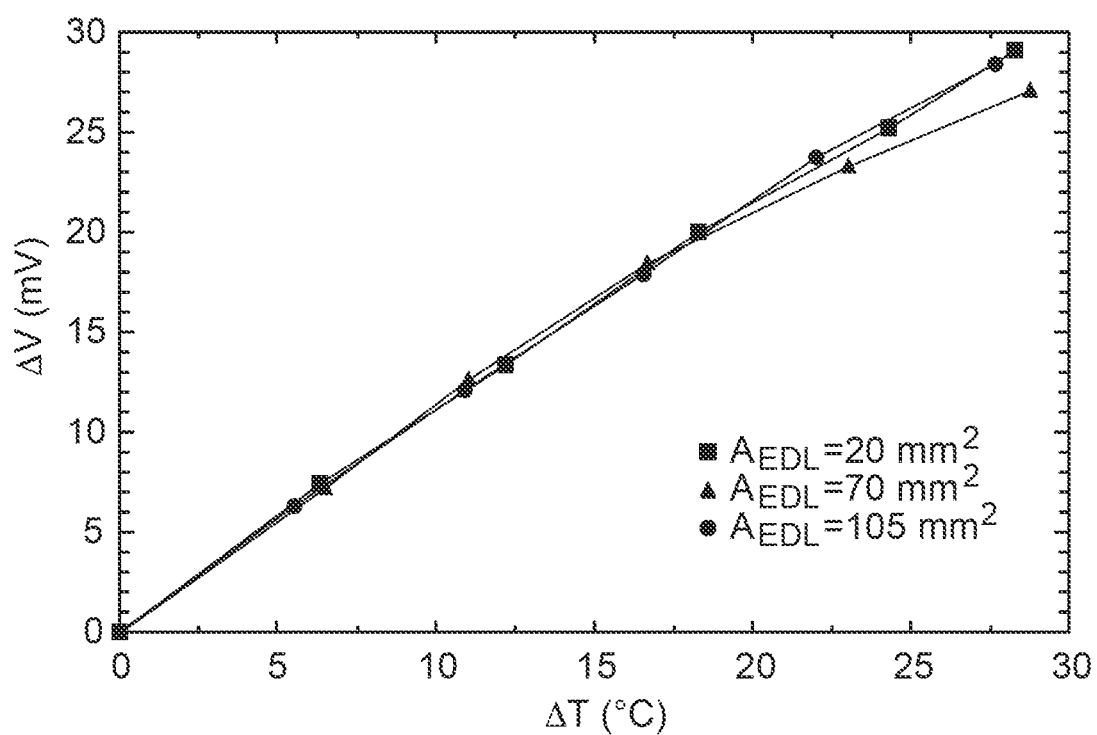
FIG. 4D is a plot of voltage change with temperature change in an electrical double layer based elastomeric temperature sensor system according to one or more embodiments demonstrating performance with different EDL areas ($A_{EDL}$) at the sensing end, where the EDL areas at the open end are fixed at 28 mm$^2$, showing that the EDL areas do not influence the sensor performance.

The effect of EDL area $A_{EDL}$ at the sensing end was studied experimentally using three samples with 20 mm$^2$, 70 mm$^2$ and 105 mm$^2$ sensing areas. In the measurement, the EDL areas at the open end are fixed at 28 mm$^2$. As shown in FIG. 4D, the EDL area does not affect the sensor performance. From the previous theoretical analysis, the EDL voltage is dependent on charge density, instead of charge number. Since change in EDL area does not change charge density, the EDL area effect can be neglected. If the EDL-based sensing end is treated as a thermal-induced power source and the generated signals transmitted through the ionic cable are recorded at the open end, EDL area will change the internal resistance of the power source, which is much smaller than the internal resistance of voltmeter. Therefore, the influence of changing EDL area is negligible on the output voltage.

Figure 5:
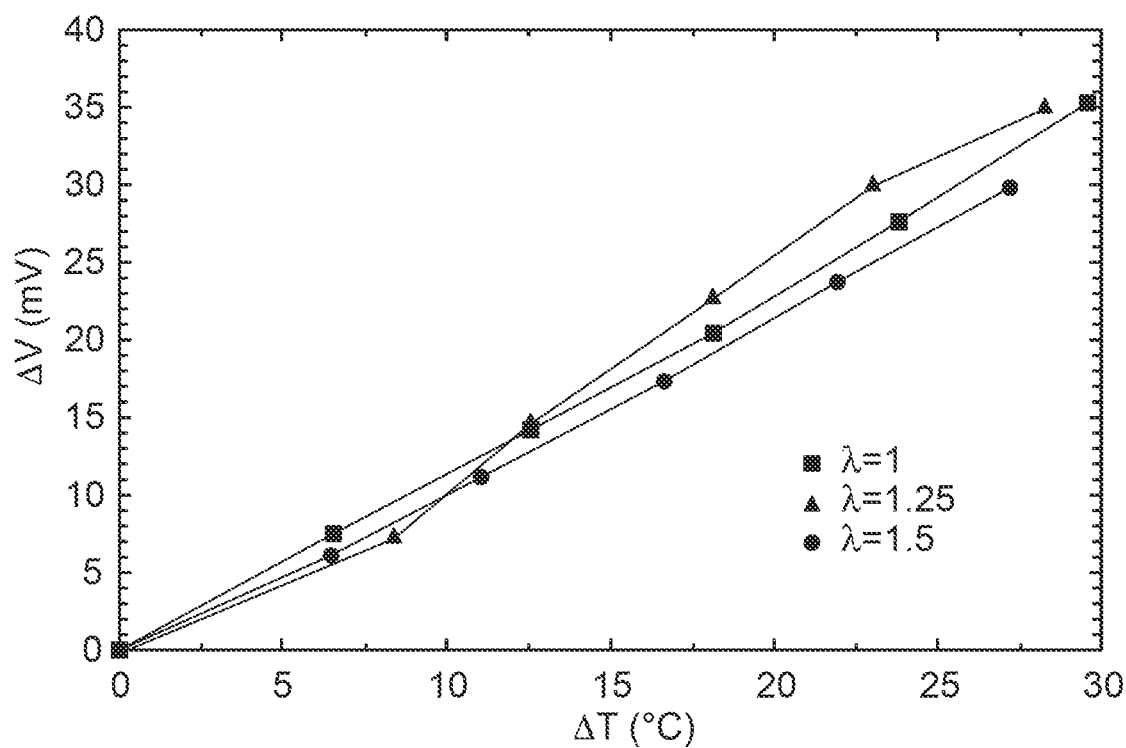
FIG. 5 is a plot of voltage change with temperature change in an electrical double layer based elastomeric temperature sensor system according to one or more embodiments demonstrating performance with different stretches ($\lambda$), showing that the sensor is highly stretchable.

Since all elements including conductive fabric, ionic conductor and dielectric are soft and stretchable, the elastomeric temperature sensor is highly stretchable, bendable, twistable, and rollable. In one or more embodiments, the elastomeric temperature sensor demonstrates excellent flexibility and conformity. In one or more embodiments, the elastomeric temperature sensor offers minimal discomfort and irritation. To test sensitivity to deformation, the change in voltage with change in temperature was measured for an elastomeric temperature sensor that was subjected to different strains. FIG. 5 plots the response curve at various uniaxial stretches 2, demonstrating that EDL voltage is insensitive to deformation.

Figure 6B:
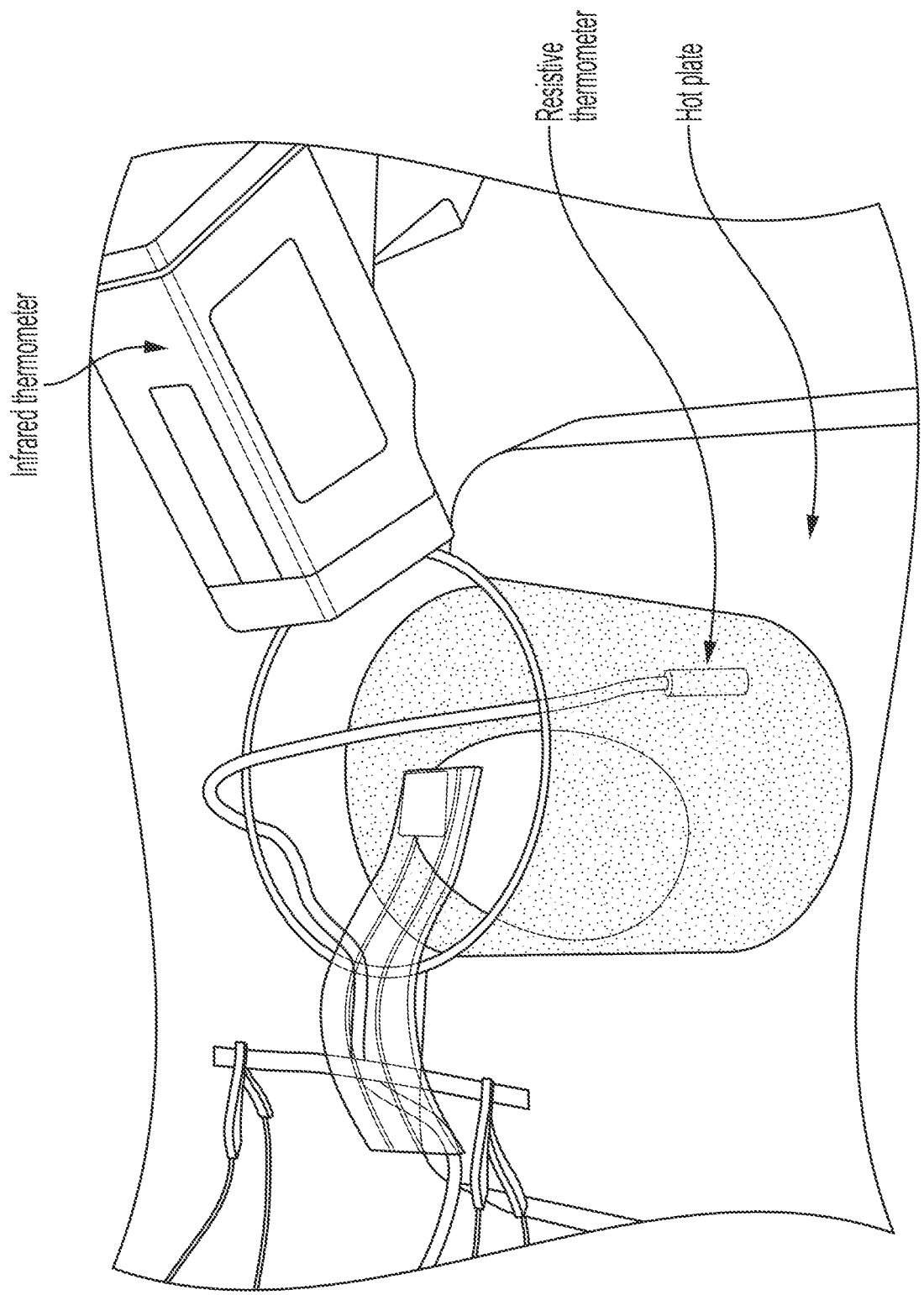
FIG. 6B is a photograph of the experimental set-up used to measure the surface temperature of a chicken egg, according to one or more embodiments.

The uniqueness of deformation-insensitive EDL voltage makes the elastomeric sensor suitable for temperature monitoring of unusual curved or complex configurations, such as surfaces of living tissues and engineering structures. FIG. 6A illustrates an elastomeric temperature sensor according to one or more embodiments that has been attached to the highly curved surface of a chicken egg, demonstrating the conformity between the sensor and curved egg surface. To measure the temperature of curved surface, the elastomeric temperature sensor was attached on the surface of an egg partly immersed in the hot water reservoir. The reservoir was heated up to reach several temperature levels by a hot plate and the temperatures were monitored by a commercial resistive thermometer. A non-contact infrared thermometer was used to measure the target temperature to provide a comparison to the temperature sensor. The experimental set-up is shown in the photograph in FIG. 6B. The results are reported in FIG. 6C and illustrate that the elastomeric temperature sensor can measure temperature as accurately as the commercial thermometer.

Unless otherwise defined, used or characterized herein, terms that are used herein (including technical and scientific terms) are to be interpreted as having a meaning that is consistent with their accepted meaning in the context of the relevant art and are not to be interpreted in an idealized or overly formal sense unless expressly so defined herein. For example, if a particular composition is referenced, the composition may be substantially, though not perfectly pure, as practical and imperfect realities may apply; e.g., the potential presence of at least trace impurities (e.g., at less than 1 or 2%) can be understood as being within the scope of the description; likewise, if a particular shape is referenced, the shape is intended to include imperfect variations from ideal shapes, e.g., due to manufacturing tolerances. Percentages or concentrations expressed herein can represent either by weight or by volume.

Although the terms, first, second, third, etc., may be used herein to describe various elements, these elements are not to be limited by these terms. These terms are simply used to distinguish one element from another. Thus, a first element, discussed below, could be termed a second element without departing from the teachings of the exemplary embodiments. Spatially relative terms, such as "above," "below," "left," "right," "in front," "behind," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly. Further still, in this disclosure, when an element is referred to as being "on," "connected to," "coupled to," "in contact with," etc., another element, it may be directly on, connected to, coupled to, or in contact with the other element or intervening elements may be present unless otherwise specified.

The terminology used herein is for the purpose of describing particular embodiments and is not intended to be limiting of exemplary embodiments. As used herein, singular forms, such as "a" and "an," are intended to include the plural forms as well, unless the context indicates otherwise.

It will be appreciated that while a particular sequence of steps has been shown and described for purposes of explanation, the sequence may be varied in certain respects, or the steps may be combined, while still obtaining the desired configuration. Additionally, modifications to the disclosed embodiment and the invention as claimed are possible and within the scope of this disclosed invention.

As such, those skilled in the art will appreciate that the conception, upon which this disclosure is based, may readily be utilized as a basis for the designing of other structures, methods, and systems for carrying out the several purposes of the disclosed subject matter. It is important, therefore, that the claims be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter, which is limited only by the claims which follow.

The invention claimed is:

1. A stretchable temperature sensor, comprising
one or more elastomeric ionic conducting layers;
at least first and second electronic conducting elements, wherein the one or more ionic conducting layers and the first and second electronic conducting elements are configured and arranged to provide at least one electrical double layer at a first contact area between the ionic conducting layer and the first electronic conducting element in a sensing end of the temperature sensor and at least one electrical double layer at a contact area between the ionic conducting layer and the second electronic conducting element in an open end of the temperature sensor;

wherein the second electronic conducting element provides a connection at the open end to an external circuit for measuring a signal generated in response to a temperature condition at the sensing end;

wherein the sensor comprises first and second elastomeric ionic layers, wherein the first electronic conducting element is disposed in between and in contact with at least a portion of each of the first and second elastomeric ionic conducting layers, and wherein two asymmetric electric double layers are formed between the first electronic conducting layer and each of the elastomeric ionic conducting layers.

2. The sensor of claim 1, further comprising an outer sealing layer.

3. The sensor of claim 1, wherein the ionic layer comprises an elastomeric hydrogel.

4. The sensor of claim 3, wherein hydrogel comprises an electrolyte.

5. The sensor of claim 1, wherein at least one of the first and second electronic conducting elements comprises an elastomeric conductor.

6. The sensor of claim 1, further comprising an insulating layer positioned between the two ionic conductor layers to insulate the two ionic conductor layers from each other.

7. The sensor of claim 1, wherein the first electronic conducting element comprises a first electrolyte having a first salt concentration and the second electronic conducting element comprises a second electrolyte having a salt concentration, wherein the first salt concentration and the second salt concentration are different.

8. The sensor of claim 7, wherein the first salt concentration is at least ten times greater than the second salt concentration.

9. The sensor of claim 7 wherein the first salt concentration is at least 10-100 times greater than the second salt concentration.

10. The sensor of claim 1, further comprising a third electronic conducting element, wherein the second and third electronic conducting elements are in electrical contact with the two elastomeric ionic layers at the open end of the temperature sensor.

11. The sensor of claim 10, wherein the electrical double layers formed at each of the pair of electronic conducting elements with its respective ionic layer cancel each other out.

12. The sensor of claim 1, wherein the sensor comprises first and second electronic conducting elements having a first elastomeric ionic conducting layer disposed in between, wherein two asymmetric electric double layers are formed between the first and second electronic conducting layers and the first ionic conducting layer.

13. The sensor of claim 12, wherein the two electronic conducting elements are at opposing ends of the ionic layer and one end forms the electrical double layer of the sensing end and the other end forms the electrical double layer of the open end.

14. The sensor of claim 12, wherein the first and second electronic conducting elements comprise first and second electronic conducting layers and the first and second electronic conducting layers are sandwiched around the first ionic conducting layer.

15. The sensor of claim 14, wherein the two electronic conducting elements are different conductors and the electrical double layers formed by contact with the ionic conducting layer are different.

16. The sensor of claim 15, wherein the first and second electronic conducting elements element provide a connection to an external circuit.

17. The sensor of claim 16, wherein at least one of the first and second electronic conducting elements is an elastomeric conductor.

18. The sensor of claim 12,
wherein the first and second electronic conducting element provides a connection to an external circuit for measuring a signal generated in response to a temperature condition at the two asymmetric electric double layers.

19. The A stretchable temperature sensor network, comprising a plurality of sensors each according to claim 18, wherein each of the sensors is separately connectable to an external detector.

20. A stretchable temperature sensor network, comprising a plurality of sensors according to claim 1, wherein each of the sensors is separately connectable to an external detector.

21. A stretchable temperature sensor, comprising
one or more elastomeric ionic conducting layers;
at least first and second electronic conducting elements,
wherein the one or more ionic conducting layers and the first and second electronic conducting elements are configured and arranged to provide at least one electrical double layer at a first contact area between the ionic conducting layer and the first electronic conducting element in a sensing end of the temperature sensor and at least one electrical double layer at a contact area between the ionic conducting layer and the second electronic conducting element in an open end of the temperature sensor;
wherein the second electronic conducting element provides a connection at the open end to an external circuit for measuring a signal generated in response to a temperature condition at the sensing end;
wherein the sensor comprises first and second elastomeric ionic layers, and
further comprising third and fourth electronic conducting elements,
wherein the first electronic conducting element is disposed in between and in contact with at least a portion of the first elastomeric ionic conducting layers and the third electronic conducting element to form a first electric double layer,
wherein the third electronic conducting element is disposed in between and in contact with at least a portion of the second elastomeric ionic conducting layers and the first electronic conducting element to form a second electric double layer, and
wherein the first and second electric double layers are different.

22. The sensor of claim 21, wherein the fourth electronic conducting element forms an electrical double layer at a contact area with the second ionic conducting layer in an open end of the temperature sensor.

23. The sensor of claim 21, wherein the third and fourth electronic conducting elements are different conductors.

24. A stretchable temperature sensor, comprising
one or more elastomeric ionic conducting layers;
at least first and second electronic conducting elements,
wherein the one or more ionic conducting layers and the first and second electronic conducting elements are configured and arranged to provide at least one electrical double layer at a first contact area between the ionic conducting layer and the first electronic conducting element in a sensing end of the temperature sensor and at least one electrical double layer at a contact area between the ionic conducting layer and the second electronic conducting element in an open end of the temperature sensor;

wherein the second electronic conducting element provides a connection at the open end to an external circuit for measuring a signal generated in response to a temperature condition at the sensing end; and wherein the temperature at the open end is fixed.

25. A stretchable temperature sensor, comprising
first and second elastomeric ionic conducting layers; and
first and second electronic conducting elements,
wherein the first and second ionic conducing layers comprise different electrolyte compositions,
wherein the first and second ionic conducting layers are immiscible, and
wherein a portion of the first and second ionic conducting layers are in contact with each other to form an electrical double layer of the sensing end,
wherein a portion of the first and second ionic conducting layers are in contact with first and second electronic conducting elements, respectively, to provide electrical double layers at a in a sensing end of the temperature sensor and at least one electrical double layer at a contact area between the ionic conducting layer and the second electronic conducting element in an open end of the temperature sensor;
wherein the first and second electronic conducting elements provide connections at the open end to an external circuit for measuring a signal generated in response to a temperature condition at the sensing end.

26. The sensor of claim 25, further comprising an insulating layer positioned between the two ionic conductor layers to insulate the two ionic conductor layers from each other.

27. A stretchable temperature sensor network, comprising a plurality of sensors according to claim 25, wherein each of the sensors is separately connectable to an external detector.

28. A method of measuring a temperature change, comprising:
providing a temperature sensor according to claim 25;
fixing the temperature at the open end of the sensor; and
reading a voltage across the sensing end of the sensor, the voltage correlating to a temperature condition.

29. The method of claim 28, wherein the temperature condition is a change in temperature.

30. The method of claim 28, wherein the temperature condition is an absolute temperature of the sensing end.

31. The method of claim 28, comprising fixing the temperature at the open end.

32. A method of measuring a temperature change, comprising:
providing a temperature sensor comprising
one or more elastomeric ionic conducting layers;
at least first and second electronic conducting elements,
wherein the one or more ionic conducting layers and the first and second electronic conducting elements are configured and arranged to provide at least one electrical double layer at a first contact area between the ionic conducting layer and the first electronic conducting element in a sensing end of the temperature sensor and at least one electrical double layer at a contact area between the ionic conducting layer and the second electronic conducting element in an open end of the temperature sensor;
wherein the second electronic conducting element provides a connection at the open end to an external circuit for measuring a signal generated in response to a temperature condition at the sensing end;
fixing the temperature at the open end of the sensor; and
reading a voltage across the sensing end of the sensor, the voltage correlating to a temperature condition.

33. The method of claim 32, wherein the temperature condition is a change in temperature.

34. The method of claim 32, wherein the temperature condition is an absolute temperature of the sensing end.

35. The method of claim 32, comprising fixing the temperature at the open end.

* * * * *